United States Patent [19]

Bird et al.

[11] Patent Number: 4,929,884
[45] Date of Patent: May 29, 1990

[54] HIGH VOLTAGE SEMICONDUCTOR WITH INTEGRATED LOW VOLTAGE CIRCUITRY

[75] Inventors: Philip H. Bird, Sidcup, England; David J. Coe, East Grinstead, Great Britain; David H. Paxman, Redhill, England; Aart G. Korteling, Waalre, Netherlands

[73] Assignee: U.S. Philips Corp., New York, N.Y.

[21] Appl. No.: 203,407

[22] Filed: Jun. 6, 1988

[30] Foreign Application Priority Data

Jun. 8, 1987 [GB] United Kingdom ............. 8713385

[51] Int. Cl.$^5$ ............................................. G05F 3/16
[52] U.S. Cl. ................................... 323/313; 323/272; 323/282
[58] Field of Search ............. 323/311, 313, 314, 267, 323/269, 272, 282; 307/296.1, 296.2, 296.5, 296.6, 296.7, 296.8

[56] References Cited

U.S. PATENT DOCUMENTS

| 4,300,061 | 11/1981 | Mihalich et al. | 323/313 X |
| 4,366,522 | 12/1982 | Baker | 323/272 X |
| 4,420,700 | 12/1983 | Fay et al. | 323/282 X |
| 4,495,536 | 1/1985 | Bynum | 323/277 X |
| 4,575,668 | 3/1986 | Baker | 323/282 X |
| 4,747,012 | 5/1988 | Maeba et al. | 363/21 X |

FOREIGN PATENT DOCUMENTS 2180423  3/1987  United Kingdom .

OTHER PUBLICATIONS

Wrathall, "The Design of a High Power Solid State Automotive Switch in CMOS-DMOS Technology", 6/85, pp. 229-233.
Glogolja et al., "Smart-Sipmos-An Intelligent Power Switch", IEEE Conference Rocord, 3/86, pp. 429-433.
Zollo, "The Boom Starts in Smart Power Products", Electronics, 7/86, pp. 97-101.
"Cars Lead the Drive to Use Smart Power", Power, Special Report, 2/87, pp. 34-35.
O'Leary, "Isolation at the Turning Point", New Electronics, 1/88, pp. 32-38.

Primary Examiner—Patrick R. Salce
Assistant Examiner—Kristine Peckman
Attorney, Agent, or Firm—Steven R. Biren

[57] ABSTRACT

Low voltage semiconductor devices are integrated monolithically with a high voltage semiconductor device on an electrically conductive substrate. The substrate forms an electrode of the high voltage device and is connected in use to the high voltage terminal of a power supply. The low voltage devices operate from a regulated low voltage supply, which is regulated with reference to the high voltage supply voltage, and not with reference to ground. This reduces the need to isolate the low voltage devices from the conductive substrate. An intelligent power switch circuit constructed in accordance with the invention is suitable for use in automotive and lighting applications.

12 Claims, 11 Drawing Sheets

HIGH VOLTAGE SEMICONDUCTOR WITH INTEGRATED LOW VOLTAGE CIRCUITRY

BACKGROUND OF THE INVENTION

The invention relates to a circuit suitable for controlling a load in an electrical system having a relatively positive, relatively high-voltage supply terminal and a relatively negative common return terminal, the circuit being adapted for connection between the high-voltage supply terminal and one terminal of the load, another terminal of the load being connected to the return terminal, the circuit comprising an electrically conductive semiconductor substrate carrying a high-voltage semiconductor output device in which conduction is predominantly by electrons, the substrate comprising a region of the output device for connection to the high-voltage supply terminal, the substrate also carrying at least one relatively low-voltage semiconductor device which is connected for operation from two low-voltage supply terminals.

Such circuits, in which a power or high voltage semiconductor device has low power devices integrated alongside, are described in R. S. Wrathall et al: "Integrated circuits for the control of high power", IEEE IEDM Technical Digest 1983, pages 408-411. The low power circuitry provided typically includes control logic and monitoring circuits closely associated with the power device, and may afford surge protection, thermal protection, short-circuit protection, current sensing and/or other features, all on-chip, giving rise to the terms "intelligent" or "smart" power chip.

High-voltage smart power chips have applications in automotive ignition circuits, or as drivers for high-voltage electroluminescent displays for example. In other applications, particularly where inductive elements are present, high-voltage breakdown capability is required even though the nominal supply voltages are relatively low. For example, in automotive electrical systems, where the supply voltage is nominally +12 or +24 volts d.c., the supply often carries spikes of 50 volts and more, of either polarity. The low power circuitry, which may for example comprise bipolar, MOS or CMOS circuitry to perform logic and/or analog functions, is typically operated from a 5 to 12 volts supply which is referenced to zero volts (or the vehicle chassis), and perhaps derived by a regulator, also on-chip. For reasons of space and expense, it is not practicable to fabricate all of this low power circuitry to have the high breakdown voltages that the power device is designed for and so high-voltage isolation is provided between the low-voltage devices and the high-voltage devices.

Devices in which conduction of the main current is predominantly by electrons include n-channel MOS transistors and n-p-n bipolar transistors. Such devices are preferred in high power applications because the mobility of electrons is superior to that of holes, which means that devices with n-type conduction can carry more current per unit area than otherwise identical devices in which conduction is by holes. If the output device is of a type having four semiconductor regions, for example a thyristor or COMFET (insulated-gate rectifier), then connection of the positive supply terminal to the substrate may be made via a region of p-type semiconductor to form the anode of such a device. Such a region may typically be provided as a highly doped layer across the back of an n-type substrate. The electrical connection to the predominant n-type region of the substrate is maintained however, since the p-n junction thus formed will be forward biassed.

The power semiconductor is often constructed so as to employ the substrate itself as one terminal. The chip can then be bonded to a metal heat sink, which also forms a terminal of the integrated circuit. This is often desirable for devices such as power MOSFETs and bipolar devices, because higher currents may then be handled using so-called vertical structures. This increases the problem of isolation when providing the low-voltage 'intelligent' circuitry on-chip because in many applications the terminal that is the substrate of the chip is one which must be connected to the high-voltage supply terminal. This is particularly the case in automotive applications, since it is frequently necessary to provide switches for headlamps, screen heaters, etc. between the positive battery terminal and a load which is permanently connected to the chassis (common return) of the vehicle. Such switches will be referred to hereinafter as 'high-side switches'. A similar problem arises in a.c. circuits or when using the 'switch' as part of a full-bridge circuit, for reversible motor control. The low-voltage devices, which conventionally operate with reference to the ground (or chassis) voltage must therefore be isolated from the substrate on which they are formed.

In the known high-side power chips the integrated low power circuitry has been isolated by the provision of special diffusions or barrier layers of differing conductivity types to interpose high-breakdown-voltage reverse-biased p-n junctions between the substrate and the low power devices or by the provision of dielectric layers. While technically satisfactory, these isolation techniques are expensive, involving one or (usually) more additional, and often special processing steps.

SUMMARY OF THE INVENTION

It is an object of the present invention to enable the production of an n-type power semiconductor with integrated low power circuitry for use in semiconductor 'high-side switches', using relatively simple processes.

The invention provides a circuit as set forth above characterized in that the circuit further comprises means for maintaining each of the two low-voltage supply terminals at a relatively low and substantially constant voltage with respect to the relatively positive high-voltage supply terminal, thereby eliminating the need for high-voltage isolation between the low-voltage device and the semiconductor substrate.

By generating the low voltage power supply with reference to the high-voltage supply terminal, the low-voltage elements of the circuit are automatically protected from harmful effects of the high voltage present on the substrate. Avoiding the requirement for special diffusin or barrier layers or for dielectric layers to achieve isolation simplifies the fabrication of the integrated circuit compared with the prior art, and therefore may afford a substantial cost advantage.

U.S. Pat. No. 4,300,061 discloses a regulated power supply for use in a low-power CMOS logic integrated circuit, the supply being referenced to the positive rail of a higher voltage supply. However there is no disclosure of such a regulator being used as a solution to the problem of isolation from the output device of a high-side power switch integrated circuit. Moreover, the vast majority of electrical systems (including automotive systems) have adopted the use of supplies regulated with reference to the more negative terminal. The first-mentioned reference (Wrathall) shows that intelligent "high-side" power switch i.c.s have hitherto been constructed with ground referenced control circuits, thus requiring complex and costly isolation from the on-chip power device.

The output device may comprise a vertical power semiconductor device. A vertical structure allows higher power-handling in many types of device, including bipolar transistors, MOSFETS and thyristors, because lateral devices have a higher resistance due to the nature of surface connections, and vertical layouts may be highly symmetrical.

The high-voltage output device may be a n-channel DMOS power transistor. The substrate will then comprise at least part of the drain region of the DMOS transistor. If a vertical DMOS structure is employed for example, its drain electrode will be formed on the back of the substrate, to provide for the connection to the positive high-voltage supply terminal. The surface-connected source electrode may then form an output for connection to the load.

Alternatively, the output device may be a n-p-n bipolar power transistor, the substrate comprising at least part of the collector of the transistor.

The low-voltage device may be a lateral MOS transistor forming part of a complementary MOS (CMOS) circuit.

At least one p-channel low-voltage MOS transistor may be formed so that its body region (or 'back-gate') is continuous with the conductive substrate and is connected to the relatively positive high-voltage supply terminal. Thus where the substrate has a predominant n-type region containing the drain or collector region of the output device as described above, the invention allows a p-channel MOSFET to be integrated directly in the n-type region, using the n-type region as the basis for the channel region of the p-channel MOSFET. This illustrates how the invention can eliminate the need for any isolation whatsoever around some low-voltage devices.

In a nMOS or CMOS type circuit, a p-type well region will be required for the n-channel devices in the usual manner, but they still do not require any high-voltage isolation from the n-type substrate. Of course the situation for pMOS and nMOS devices described above reverses if the substrate used is predominantly p-type for any reason.

CMOS technology is advantageous for the low power circuitry as it is "self-isolating", that is to say that no isolation is required between the different low voltage transistors within the low power circuit, except of course for the well region required to isolate transistors of the opposite channel-type. Thus, by use of the present invention, the construction of a CMOS logic circuit alongside the high-voltage device need be little more complex than constructing a conventional CMOS logic chip.

Alternatively, or in addition to MOS devices, at least one low-voltage semiconductor device may be a bipolar transistor. The bipolar transistor may be a lateral bipolar transistor, if required by the nature of the circuit. Low-voltage vertical bipolar transistors may be used in common-collector configuration, i.e. with their collectors connected to the conductive substrate. In such cases, no isolation at all is required. In other configurations, it may be necessary to use lateral devices, so that they may be isolated one from another within the low power circuitry. This may involve the use of wells or other diffusions just as in ordinary low-voltage bipolar integration: use of a high-voltage-referenced supply in accordance with the invention avoids a need for special high-voltage isolation.

The low-voltage supply may be provided from the high voltage supply by a regulator circuit. Such a circuit may employ breakdown devices such as Zener diodes, or else may use a series chain of MOS transistors. The latter method has the advantage of defining the supply voltage in terms of MOS transistor threshold voltages, and can thus provide the optimum supply voltage for a MOS-constructed low voltage circuit. Either form of regulator may conveniently be integrated monolithically with the high- and low-voltage semiconductor devices.

One of the low-voltage supply terminals may be connected directly to the relatively positive high-voltage supply terminal. This may simplify the design of the circuit.

The circuit may include a level-shifting circuit for interfacing between the high-voltage-referenced low-voltage circuitry and high-voltage or other zero-referenced parts of the circuit, or the outside world. The level shifting circuit may comprise a high-voltage low-power transistor.

Embodiments of the invention will now be described, by way of example, with reference to the accompanying drawings, in which.

Figure 1A:
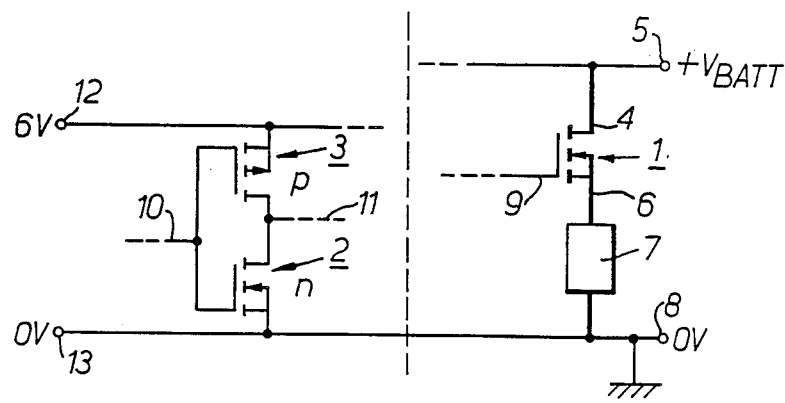
FIG. 1A shows part of a prior art electrical circuit.

FIG. 1A shows schematically part of a prior art circuit comprising an n-channel power MOSFET 1 and complementary low-voltage MOSFETs 2 (n-channel) and 3 (p-channel). The high-voltage power FET 1 has its drain 4 connected to a high-voltage supply terminal 5 and its source 6 connected to one terminal of a load 7. The other terminal of load 7 is connected to a common return terminal 8, which may typically be an earth connection, the chassis of a piece of equipment, or a motor vehicle chassis. The gate 9 of the power FET 1 is connected to other parts of the circuit (not shown), according to functional requirements.

As a simple example of a low power circuit to be integrated with the power FET 1, the low-voltage FETs 2 and 3 are shown connected as a conventional CMOS inverter circuit having an input 10 and an output 11, for connection to other parts of the circuit (not shown) according to functional requirements. The power supply for the inverter (MOSFETs 2 and 3) is derived from two low-voltage supply terminals 12 and 13. In accordance with current practice, one of these terminals, terminal 13, is connected to the earth or return terminal 8.

In operation, a high voltage supply for driving the load 7 is applied from a battery or an alternative supply to terminals 5($V_{BATT}$) and 8(0V). For the polarity of power FET 1 described (n-channel), then $V_{BATT}$ will be positive with respect to return (0V), but of course transistors having the opposite conductivity types could be used where appropriate if $V_{BATT}$ were negative. $V_{BATT}$ may be nominally +12 or +24 volts, as in motor vehicle electrical systems. These voltages are not particularly high but may be subject to voltage fluctuations, and in particular high-voltage transients or 'spikes' of 50 volts and more. Alternatively, $V_{BATT}$ may intentionally be a medium-high voltage, say, 50 volts or more, when the circuit is used in other applications such as drivers for fluorescent or electroluminescent displays, programmable logic controllers (PLC), or in a.c. mainsvoltage equipment and other applications which will be apparent to those skilled in the art.

For operation of the low voltage circuitry, including MOSFETs 2 and 3, a low voltage supply of, say, 5 to 12 volts is applied to terminals 12 and 13. The low-voltage supply may be supplied by a battery, or more likely by a regulator circuit (not shown) which can be integrated with the rest of the circuit and which may use MOSFETs or breakdown diodes to provide a voltage reference.

Figure 1B:
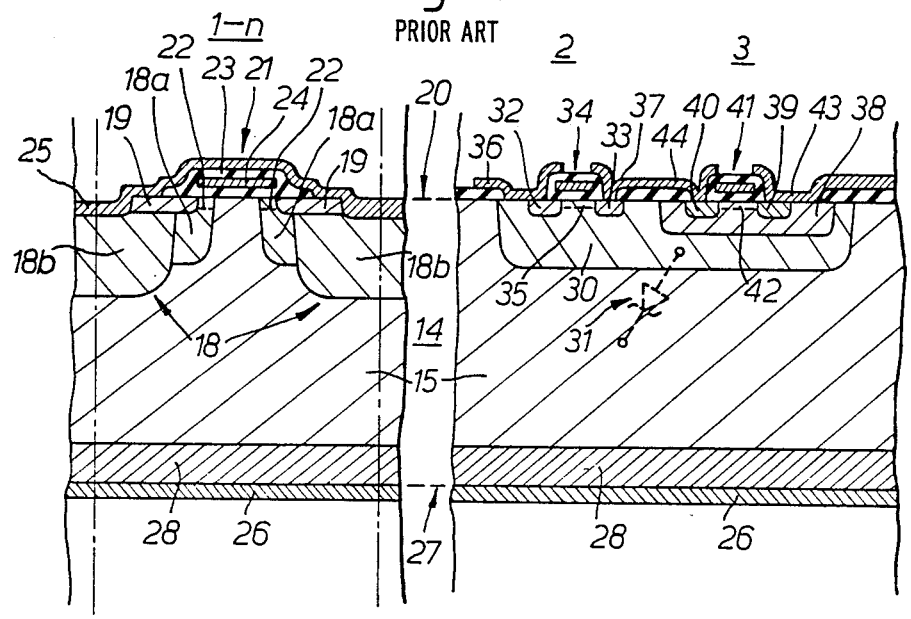
FIG. 1B shows schematically the integration of components of the circuit of FIG. 1A.

FIG. 1B shows a possible implementation of the circuit shown in FIG. 1A in a semiconductor body 14. The semiconductor body 14 comprises mainly a lightly doped (for example n-type) semiconductor substrate region 15, and carries the DMOS vertical power FET 1 and complementary low-voltage MOSFETs 2 (n-channel) and 3 (p-channel).

The vertical power MOSFETs 1 is so called because the source and drain contacts are on opposite surfaces of the semiconductor body so that current flow is in a vertical direction through the semiconductor body. Such a vertical power MOSFET is normally made up of many hundreds of parallel-connected MOSFET cells having a common drain region and it should be appreciated that in the interests of clarity FIG. 1B shows only a small representative part of the vertical power MOSFET 1.

As shown in FIG. 1B, a cell 1-n of the vertical power MOSFET 1 includes a body region 18 of p-type semiconductor formed within the n-type substrate 15, the n-type substrate forming a drain region of the power MOSFET 1. The body region 18 comprises a relatively deep and relatively highly-doped region 18b and a surrounding relatively shallow region 18a. A source region 19 of n-type semiconductor (in this example) is provided within the body region 18 adjacent a top surface 20 and an insulated gate structure 21 overlies part of the surface 20 so that the underlying shallow region 18a provides a channel area 22 which, under control of a signal applied to the insulated gate structure 21, provides a gateable connection between the source and drain regions 19 and 15. The insulated gate structure 21 comprises a relatively thin insulating layer 23 of, for example, silicon dioxide and an overlying electrically conductive gate layer 24 of, for example doped polycrystalline silicon. The conductive gate layer 24 may however be a metal layer or a metal silicide layer or a composite of two or more of the afore-mentioned layers.

A source metal layer 25 is provided on the surface 20 for external contact to source region 19, and also extends to contact the deep body region 18b, to prevent parasitic bipolar action. Contact to the drain region 15 is preferably by means of metallisation 26 of the opposite surface to surface 20, the bottom surface 27. Close to surface 27, the doping of the semiconductor body 14 is increased to form a layer 28 suitable for ohmic contact. The metallisation 26 may in fact, be directly bonded to a metal header, upon which the entire semiconductor body 14 is to be mounted, and which can thus function both as a low-resistance drain contact and a heatsink for the power MOSFET 1.

When the power MOSFET 1 is operating as a 'high-side' control device, as is the MOSFET 1 in FIG. 1A, then the conductive n-type (in this example) substrate region 15 is at the potential of the high-voltage supply, $V_{BATT}$. The low-voltage MOSFETs 2 and 3 are constructed at another part of the top surface 20 of the semiconductor body 14 and in accordance with current practice, they are constructed entirely within a p-type (where substrate region 15 is n-type) well region 30, for isolation. The p-n junction formed between the p-well 30 and the n-substrate 15 is illustrated as a dotted diode 31. To construct the n-channel MOSFET 2, the p-well 30 is used as the body region and relatively highly doped n-type diffused or implanted regions 32 and 33 form the source and drain regions respectively of MOSFET 2. An insulated gate structure 34, similar to the structure 21 of the power MOSFET 1, is provided over an area of the p-type region 30 between the source and drain regions, to define a channel region 35. Metallisation at 36 and 37 provides contact to the source and drain regions 32 and 33 respectively, with the source metallisation 36 extending over another area of the p-type region 30 to short the body region of the MOSFET 2 to its source and prevent parasitic bipolar action.

A body region for the p-channel MOSFET 3 is formed in this example by an n-type well region 38, provided within the p-well 30 for example by diffusion or implantation. Within the n-well 38, relatively highly doped p-type regions 39 and 40 form the source and drain regions respectively of the MOSFET 3, with an insulated gate structure 41 defining a channel region 42 between the source and drain regions 39 and 40 within the n-well 38. Source and drain metallisation is provided at 43 and 44 respectively, for connection to the p-type regions 39 and 40 respectively. The source metallisation 43 extends beyond the source region 39 in a direction away from channel region 42 to contact another part of the n-type well region 38, to prevent parasitic bipolar action.

The low-voltage parts of the circuit such as MOSFETs 2 and 3, which are constructed within the p-well 30, are driven by the earth-referenced low-voltage supply (terminals 12 and 13 in FIG. 1A), and so the semiconductor within the p-well is at zero volts during operation, whereas the n-type substrate region 15 is at the high-voltage supply potential $V_{BATT}$. Thus the effective diode 31 is reverse biassed and isolates the low voltage components 2, 3 from the voltage $V_{BATT}$, provided it is constructed so as not to break down, even in the presence of high voltages (more than 50 volts, say) on the supply $V_{BATT}$.

To provide this degree of isolation, it is known to use a simple diffusion process to produce a surrounding p-type region such as the p-well 30 in FIG. 1A, but other manufacturers employ more complex techniques, involving buried p-type epitaxial layers within the n-type substrate, buried 'plugs' of n-type material and involving deeply diffused barriers of p-type material between the high- and low-voltage devices. Examples of these latter techniques are described in the first-mentioned citation (Wrathall et al), and include Motorola's SMARTpower I and II processes, and National Semiconductor's STEEL process. Whichever of the known techniques is used, the end result is to surround the low voltage devices with a barrier of p-type material, which is functionally equivalent to p-well 30 in FIG. 1B. As well as being expensive to provide, there is a risk that the complex construction leads to higher on-resistances for the power devices, which is generally undesirable. Very low leakage isolation can be obtained by providing layers of dielectric, usually silicon dioxide, between the components to be isolated. This is also a difficult and costly form of isolation.

Figure 2A:
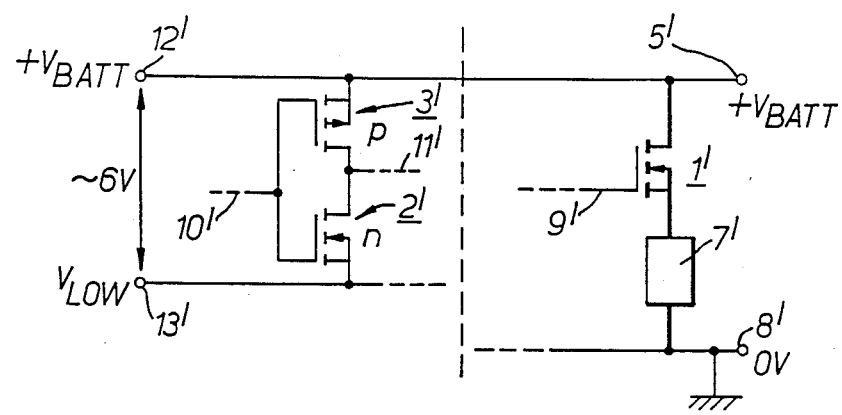
FIG. 2A shows part of an electrical circuit in accordance with the present invention.

The circuit of FIG. 2A, which is constructed in accordance with the present invention, is functionally similar to that of FIG. 1A, with the same reference numerals used for corresponding elements, but primed. The difference between the two circuits is that in FIG. 2A, low voltage supply terminal 13' is disconnected from earth terminal 8' ($V_{LOW}$), and the other low-voltage supply terminal 12' is connected to the high-voltage supply terminal 5'. In operation, a voltage $V_{LOW}$ is generated at terminal 8', by a regulator or a battery (not shown in FIG. 2A), to provide a regulated low-voltage supply of say between 5 and 12 volts between terminals 12' and 13', but regulated with reference to the high-voltage supply potential $V_{BATT}$, and not with reference to earth.

Figure 2B:
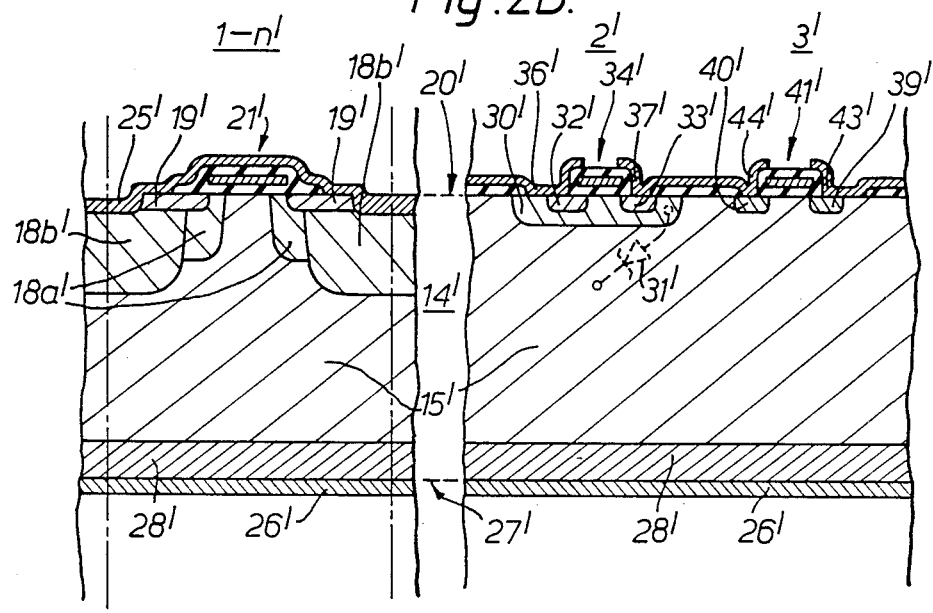
FIG. 2B shows schematically the integration of components of the circuit of FIG. 2A.

As can be seen from FIG. 2B, this arrangement allows a far simpler integration of the low-voltage MOSFETs 2' and 3' with the high-voltage power MOSFET 1', which is constructed identically to MOSFET 1 in FIG. 1B.

The p-type source and drain regions 43' and 44' of the p-channel MOSFET 3' are now provided directly in the n-type substrate region 15': since the circuit of FIG. 2A shows that source 43' and body 38' regions of the p-channel MOSFET 3' are connected directly to $V_{BATT}$, no isolation is required. A small p-well region 30' is provided for the construction of the n-channel MOSFET 2, as in any conventional low-voltage CMOS integrated circuit, but the breakdown voltage of the effective diode 31' is now only required to exceed the 5 to 12 volts of the low voltage supply ($V_{BATT}-V_{LOW}$), and not the full range of the high voltage between $V_{BATT}$ and 0V.

Thus, the use of the invention has eliminated at least one processing step, and probably several, namely those required to provide the p-type barrier region(s). Moreover, greater flexibility has been afforded in the choice of process steps and dopant concentrations etc. during manufacture.

Of course, the integration shown in FIGS. 1B, 2B, is purely schematic, and it will be readily apparent to those skilled in the art that the cross-section shown is not drawn to scale, with vertical dimensions in particular being exaggerated for clarity. Also, detailed features of the integration, particularly those relating to the high-voltage performance of the power devices, have not been shown. Such details are within the knowledge of the worker skilled in the art and will depend on the particular application. Further, these features will vary from manufacturer to manufacturer depending on the processes used by each manufacturer. For example, it is known to provide so-called RESURF (REduced SURface Field) regions in high-voltage devices, as described in detail in, for example, a paper entitled 'High voltage thin layer devices (RESURF devices)' by J. A. Appels et al, published in Philips Journal of Research Vol 53 No. 1 (1980) at pages 1 to 12. As another feature, the edges of, for example, a gate layer in a power MOS device may be bevelled or tapered using a technique such as that described in Siemens Forsch-u.Entwickl-Ber.Bd 9 (1980) Nr. 4 at page 192.

The regions of the low-voltage devices are preferably formed at the same time as those of the high-voltage devices, using the same diffusion and implantation steps. This is simple to achieve with the present invention, particularly where the need for extra process steps (to provide RESURF regions for example) for the high-voltage devices provides flexibility in the construction of the low-voltage devices. Thus, for example, the p-well 30' for the n-channel could be formed at the same time as the p-type regions 18a or 18b of the power MOSFET 1', but also it could be formed simultaneously with a p-type RESURF region, which may, for example, be required as part of a p-channel high-voltage transistor, elsewhere on the same chip.

Of course, only one cell of the power MOSFET 1' has been illustrated, and in practice the power device will extend into a regular array of hundreds or even thousands of such cells, as is well known in the art. When viewed in plan, the geometry of the cells and of the array may vary, each cell for example being circular, or square/rectangular with rounded corners, or hexagonal. Bipolar power devices may also be constructed as an array of cells, but are more commonly made with an inter-digitated emitter structure, as is well-known in the art. The choice of detailed construction of such devices is of course a matter of design and preference for the individual manufacturer and the particular application.

The circuit of FIG. 2A is, of course, not complete as shown, and as well as more elaborate low-voltage logic or analogue functions being required in a practical power controlling application, a voltage regulator and level shifting circuits will normally be required, to connect the low-voltage elements safely to the high-voltage parts of the circuit. Such circuitry may take any form, but embodiments suitable for a particular application will be described hereinafter. The low-voltage circuitry may of course require other devices than the enhancement-mode MOSFETs described explicitly hereinbefore. Techniques for the production of depletion-mode MOSFETs (n-and p-channel) and bipolar transistors (npn and pnp) in low-voltage logic or analogue integrated circuits are well known. The present invention allows the use of these known techniques, with only a little or no adaptation, to integrate such devices alongside a high-voltage power semiconductor. If the transistors 2' and 3' shown in FIG. 1B were to be constructed as depletion-mode MOSFETs, for example, their channel regions 35' and 42' would be permanently doped so as to be n-type and p-type respectively. Depletion-mode MOSFETs are useful in very low-power MOSFET circuits, since they can provide compact high-value resistance devices when formed with their gate and source electrodes shorted together.

Figure 3A:
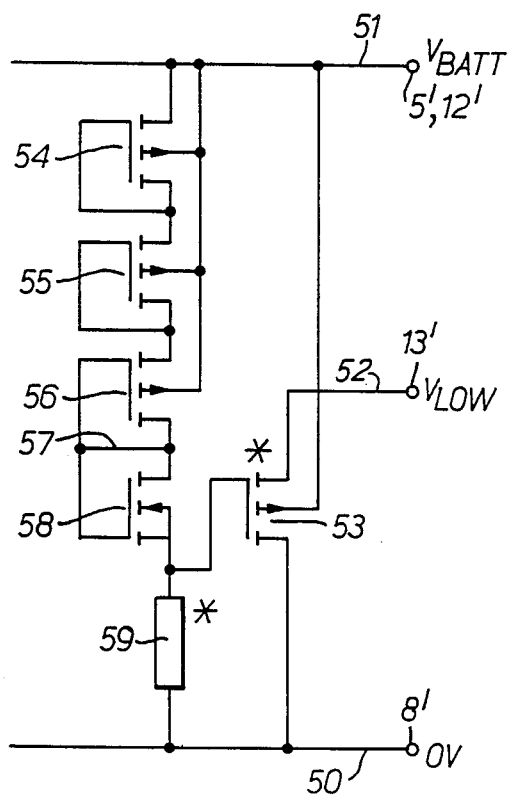
FIGS. 3A and 3B show two alternative embodiments of a voltage regulator circuit suitable for use in a circuit in accordance with the invention.

FIG. 3A shows a readily integratable voltage regulator circuit suitable for use in embodiments of the present invention. The regulator shown in FIG. 3A has an input 50 connected to the common return terminal of a high-voltage supply, for example the terminal 8' (OV) of a circuit such as that shown in FIG. 2A. The circuit has another input 51 connected to the high-voltage supply terminal (for example, terminal 5' ($V_{BATT}$) of FIG. 2A) and an output 52 connected to one of a pair of low voltage supply terminals, such as terminal 13' ($V_{LOW}$) in the example of FIG. 2A. The other low-voltage supply terminal (12') is connected to the high-voltage supply (terminal 5' ($V_{BATT}$)), in accordance with the present invention.

A high-voltage p-channel MOSFET 53 has its source connected to output 52 ($V_{LOW}$) and its drain connected to input 50 (OV), in a source-follower arrangement. MOSFET 53 is marked with an asterisk ("*") to indicate that although it is a relatively low-power transistor, it must be constructed as a high-voltage device, for example a high-voltage lateral DMOS (Double-diffused Metal Oxide Semiconductor) transistor. It should hereby be understood that all devices marked with an asterisk ("*") in the Figures referred to in this specification are constructed as high-voltage devices, such devices being used at places in the circuit where function dictates that isolation from the high voltages of the supply is not appropriate.

Three low-voltage p-channel MOSFET's 54,55,56 are connected in series between input 51 ($V_{BATT}$) and a node 57, with the source of MOSFET 54 connected to the input 51 and the drain of MOSFET 56 connected to the node 57, and each MOSFET 54,55,56 has its gate connected directly to its drain. A low-voltage n-channel MOSFET 58 has its gate and drain both connected to the node 57, and its source connected to the gate of the MOSFET 53, and also via a resistance 59 to input 50 (OV). The resistance is preferably formed by a high-voltage n-channel depletion-mode MOSFET with gate and source connected together, since this provides a large resistance within a relatively small area of semiconductor. This construction of resistance device may conveniently be used for many of the resistances required in the circuit of an intelligent power chip.

In operation, a positive (in this example) voltage $V_{BATT}$ is applied to the input 51, and a small current flows through the series chain of MOSFETs 54–58 and through the resistance 59. Each MOSFET drops a voltage approximately equal to its threshold voltage, so as to define a reference voltage at the gate of MOSFET 53 which is substantially constant at $V_{BATT}-3V_{THP}-V_{THN}$, where $V_{THP}$ and $V_{THN}$ are the threshold voltages of the p-channel and n-channel MOSFETs respectively. This reference voltage is buffered by the source-follower MOSFET 53 to generate the output voltage $V_{LOW}$ at output 52, while introducing a drop of $V_{THP}$.

Thus $$V_{LOW}=V_{BATT}-3V_{THP}-V_{THN}+V_{THP}$$

or, typically $$V_{LOW}\approx V_{BATT}-6 \text{ volts.}$$

The MOSFET 53 must of course be capable of handling enough current to supply all of the low-voltage circuitry to be powered in accordance with the invention, typically a few milliamps.

The circuit of FIG. 3A has the advantage that the low-voltage supply voltage $V_{BATT}-V_{LOW}$ is defined in terms of MOSFET threshold voltages (being approximately $3V_{TH}$), and this provides the otpimum conditions for the operation of CMOS circuitry.

Figure 3B:
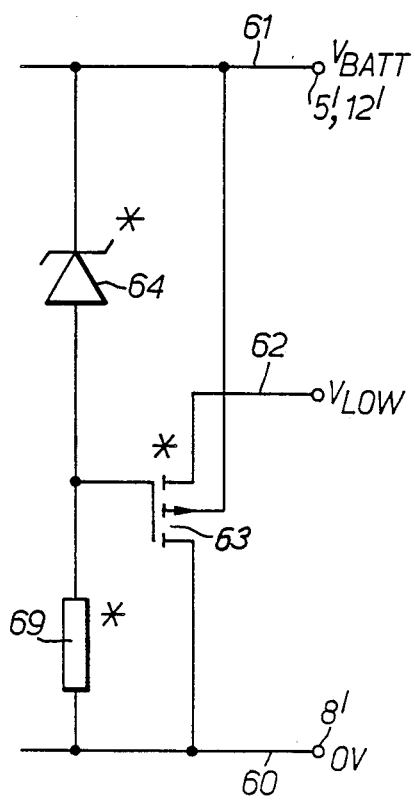

FIG. 3B shows a regulator using a zener or avalanche breakdown diode rather than MOSFETs to define the supply voltage. The circuit is similar to that of FIG. 3A, with inputs 60 and 61 corresponding to inputs 50 and 51 in that Figure, output 62 corresponding to output 52, MOSFET 63 corresponding to MOSFET 53 and resistance 69 corresponding to resistance 59. The four MOSFETs 54 to 58, however, are replaced by the breakdown diode 64, which has its cathode connected to input 61 and its anode connected to the gate of MOSFET 63 and via resistance 69 to input 60 (OV). The diode 64 will most conveniently be fabricated in the same process steps as the other semiconductor devices in the circuit, and so its breakdown voltage may well be dictated by the doping requirements of those other devices. In a particular embodiment, for example, diodes are only available having a breakdown voltage of 12 to 14 volts, so that the supply voltage $V_{LOW}$ at output 52 may be around 10 to 12 volts below $V_{BATT}$. Of course this may be just what is required, but even when 6 volts, say, would be preferred, for example for CMOS logic circuitry, the regulator of FIG. 3B still has the advantage that the current flow through the reference chain 64,69 is lower than that through the chain 54–58,59 in the regulator of FIG. 3A. This current is low, and may be insignificant when the integrated circuit is operating from a renewable power supply, but it may become important in battery powered applications. For example, in a motor vehicle, the current drawn from the battery when the power switch is in the 'off' state must be so low that the battery is not significantly discharged over weeks or even months of disuse. There may be 50 to 100 switching chips such as those described above within each motor vehicle, and it is preferable that the current consumption of each chip be less than, say, 10 microamps.

Figure 4:
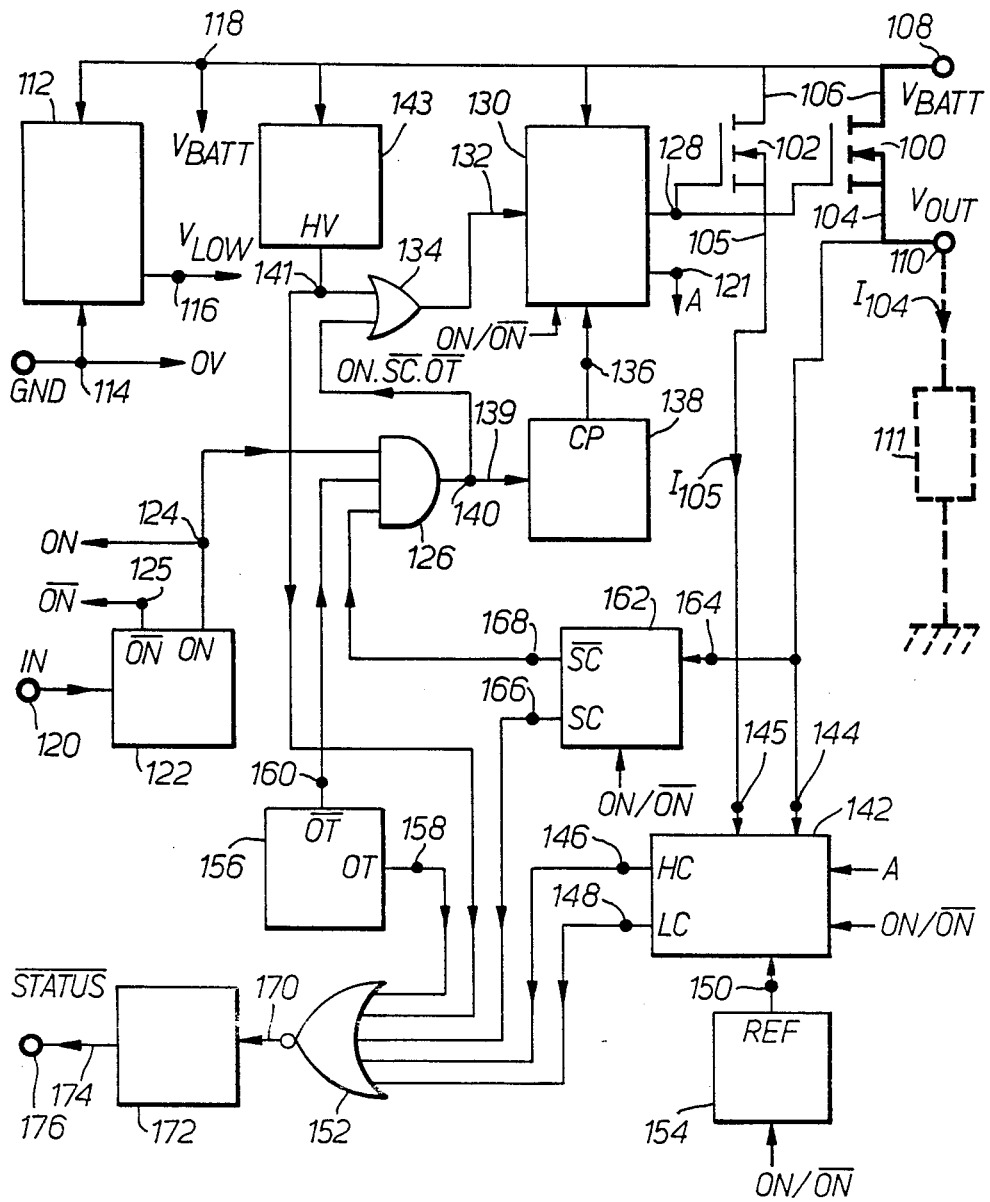
FIG. 4 is a block schematic diagram of an intelligent power switch circuit in accordance with the invention.

FIG. 4 shows an intelligent power switch circuit, suitable for example, for controlling a lamp, motor etc. in a 12–24 volt motor vehicle electrical system. The power output device is a vertical power MOS transistor (MOST) 100 in common-drain configuration. The drain 106 of the power MOST is connected to a supply terminal 108, for connection to the positive battery terminal. As described earlier, the drain 100 is in fact the substrate of the semiconductor chip, and so terminal 108 may be a body of metal to which the chip is bonded, and may also serve as a heatsink for the power device. The source 104 of the power MOST 100 is connected to output terminal 110, for connection to the 'high-side' of a load 111 (shown dotted). The load 111 may be for example a headlamp bulb, or a motor winding.

MOST 100 is constructed in a known cellular fashion and contains of the order of 10,000 cells. One of these cells 102 has a separate source electrode 105, and is used for current sensing, in a manner to be described hereinafter.

The remainder of the circuit comprises low power circuitry for control or protection of the power MOST 100 and is integrated on the same substrate as the MOST 100 in accordance with the invention. A regulator circuit 112 is connected between supply terminal 108 and ground terminal 114, which in use is connected to the battery negative terminal via the vehicle chassis. The regulator may be constructed for example in accordance with FIG. 3A or FIG. 3B, so as to provide at its output 116 the low-voltage supply. A terminal 118 connected to the supply terminal 108, and the output 116 of the regulator 112 together form the low voltage supply and are connected as required to various of the other parts of the circuit.

An input terminal 120 is provided to receive a control input signal and is connected to an input of level shifter 122. The output 124 (ON) of the level shifter 122 is connected to a first input of a AND gate 126. The level shifter 122 also has a complementary output 125 ($\overline{ON}$), and the outputs 124 (ON) and 125 ($\overline{ON}$) are connected for various purposes to control inputs of the following: a master current source circuit 154; a charge pump circuit 130; a current sensing circuit 142; and a short circuit detection circuit 162. The output of the AND gate 126 is connected to a first input of an OR gate 134 and to a gating input 139 of the charge pump circuit 138. The level shifter 122 and AND circuit 126 are described hereinafter in more detail with reference to FIG. 5.

The commoned gate electrodes 128 of the power MOST 100 and sensing cell 102 are connected to an output of a charge pump circuit 130. Charge pump circuit 130 has a gating input 132 connected to the output of the OR gate 134, and a clock input 136 connected to the output of a charge pump oscillator circuit 138, which may for example be constructed as a ring oscillator using a number of inverter circuits. An embodiment of a circuit suitable for use as the charge pump oscillator circuit 138 is described in detail with reference to FIG. 7.

An output 141 of a high-voltage detection circuit 143 is connected to a second input of OR gate 134 and a first input of a NOR gate 152.

An arrangement embodying circuits suitable for use as the charge pump 130, OR gate 134 and high voltage detection circuit 143 is described in detail with reference to FIG. 8. The charge pump circuit 130 has a further output 121 which is connected to a further control input of the current sensing circuit 142, as described hereinafter with reference to FIG. 9. The current sensing circuit 142 has inputs 144 and 145 connected respectively to the source 104 of the power MOST 100 and the source 105 of the current sensing cell 102.

In this embodiment, the current sensing circuit 142 has two logic outputs 146, 148 and a current reference input 150. The outputs 146 and 148 are connected respectively to third and fourth inputs of the NOR gate 152. An embodiment of a circuit suitable for use as the current sensing circuit 142 is described in detail with reference to FIG. 9.

The current reference input 150 of the circuit 142 is connected to the master current source 154. An embodiment of a circuit suitable for use as the master current source 154 is described in detail with reference to FIG. 6.

A temperature sensing circuit 156 has an output 158 which is connected to a further input of the NOR gate 152, and has a complementary output 160 which is connected to a second input of AND gate 126.

The short-circuit detection circuit 162 has an input 164 connected to the output terminal 110. The circuit 162 also has an output 166 connected to a fifth input of the NOR gate 152, and has a complementary output 168 connected to a third input of AND gate 126. An embodiment of a circuit suitable for use as the short-circuit detection circuit 162 so described in detail, with reference to FIG. 11.

The output 170 of the NOR gate 152 is connected to the input of an output level shifting circuit 172. An output 174 of the level-shifting circuit 172 is connected to a status output terminal 176. This brings the total number of terminals of the circuit to five: terminals 108, 110, 114, 120 and 176. Thus, if the entire circuit of FIG. 4 is to be fabricated as a single integrated circuit (i.c.), it may conveniently be packaged in a 5-pin power i.c. package, such as the SGS 'Pentawatt' package, which is a 5-pin version of the common TO-220 power transistor package.

The circuit may form part of a circuit module including, for example decoding circuitry for multiplexed control signals. In this case an alternative package may be desirable, or direct mounting of the bare chip on a substrate with other i.c.s. This may also allow more connections to be made to the i.c., and allow more comprehensive fault detection, or separate operation of more than one switch on the same chip.

In operation, the terminal 114 is connected to the zero-voltage (OV) line of the power supply. In a negative-earth motor vehicle, this is the chassis or ground voltage, GND. The terminal 108 is connected to the battery positive electrode, at voltage $V_{BATT}$. $V_{BATT}$ may be nominally 12 V (cars) or 24 V (trucks, etc.), but will in any case be subject to variations of several volts, and also to 'spikes', or high-voltage transients, of 50 volts or more. These spikes arise from the switching of inductive components within the electrical system, which may arise in normal operation or as a result of battery disconnection. A central filter circuit (not shown) may be provided in the system to limit the more energetic spikes to be not more than 50 V, but short duration spikes of much higher voltage will often still be present at the terminal 108.

A load 111 is connected between output terminal 110 and the chassis (GND). Thus the power transistor 100 controls the flow of current through the load 111, according to the voltage between gate electrode 128 and source electrode 104.

The remainder of the circuit is concerned with controlling and monitoring the condition of the MOST 100 and the load 111. Oscillator 138 and charge pump 130 drive the gate of the power transistor 100 in response to a logic signal 'IN' applied to control input 120. The levels used to represent the values '0' and '1' for IN are determined by the requirements of the external circuitry. The levels may, for instance, be TTL levels 0 V ('0') and 5 V ('1'), with reference to GND. Whatever the actual levels are, IN=1 signals that the load is desired to be on (MOST 100 conducting) and IN=0 signals that the load is desired to be off (MOST 100 not conducting). The level shifter 122 translates the logic signal IN to a complementary pair of logic signals ON-/$\overline{ON}$, at levels suitable for the high-voltage referenced circuitry.

In normal operation, when neither over temperature or a short circuit load has been detected, the application of a logical '1' at input 120 will cause the signal ON to go to a logical '1'. This will cause the oscillator 138 to run and drive charge pump 130 in response to signals at gating inputs 140 and 132. This drives the gate of the output transistor 100 to a voltage several volts above $V_{BATT}$, and so turns the MOST 100 on, energising the load 111.

However, temperature sensing circuit 156 monitors the of the power transistor MOST 100 and if that temperature exceeds, say, 150 degrees Celsius, the circuit 156 generates a signal OT=1/$\overline{OT}$=0 at its outputs 158, 160. The output at 160 when $\overline{OT}$=0 inhibits the AND gate 126 causing the gating inputs 140 and 132 of the charge pump circuit 130 and oscillator 138 to be held low when OT=1. The charge pump circuit 130 then turns off the MOST 100, de-energising the load 111. Thus the circuit of FIG. 4 protects itself during periods of extreme high temperature by overriding the control input signal IN to disable the output transistor 100 until the temperature drops again to a safe level, say below 140 degrees Celsius. The circuit 156 is preferably integrated very close to the MOST 100/102, and may for example use a p-n junction or a resistance as a temperature-sensitive element. Alternatively, over-temperature protection may be provided by an arrangement such as that described in EP-A-0208970.

Short-circuit detector circuit 162 monitors the output voltage $V_{OUT}$ at terminal 110. If $V_{OUT}$ is near GND when the load 111 should be energised, instead of being close to $V_{BATT}$, this is taken to indicate a short-circuit of the load 111, and signal $\overline{SC}$=0 at output 168 of the circuit 162 causes the charge pump 130 and oscillator 138 to be disabled by means of signals applied to gating inputs 132 and 140, thereby overriding the control signal ON=1 and turning off the output transistor 100. The circuit 162 may include a time delay circuit, so that the output transistor 100 is turned on again periodically until the short-circuit is cleared.

High-voltage detection circuit 143 generates a logic signal HV=1 at its output 141 when the supply voltage $V_{BATT}$ exceeds a given potential, for example 50 volts during a high-voltage spike. This signal (HV) is applied to the OR gate 134 and consequently the gating input 132 of the charge pump 130 goes to a logical '1', even when ON=0, that is to say even when the desired state of the MOST 100 is off. Although the oscillator 138 is not operating when ON=0, the charge pump still responds to its input 132 by raising the voltage at the gate 128 of output transistor 100 almost to $V_{BATT}$, thereby turning it on at least enough so that the energy of the spike is dissipated in the load 111, and not in the MOST 100 itself.

In one embodiment the current sensing circuit 142 operates by drawing a current $I_{105}$ from the source 105 of the separate single cell 102 of the power transistor 100/102 until the voltage at 105 is the same as that at 104. The current $I_{105}$ is then accurately proportional to the output current $I_{104}$ through the load 111. This technique provides accurate current sensing without the need for resistance in series with the load.

Master current source 154 allows circuit 142 to compare the measured current with predetermined threshold values. A signal LC=1 is generated at output 148 if the load current is below a certain threshold, while a signal HC=1 is generated at output 146 to indicate that the current is above a certain threshold.

Clearly, a signal such as HC could be used in place of signal SC to indicate a short-circuit, but the threshold for signal HC may be just a few times the nominal load current, and be used to indicate to external circuitry via the terminal 176, that there is a high current condition not as serious as a short circuit. Therefore, output 146 in this embodiment is not connected to AND gate 126, and so HC does not turn off the power MOST 100 by overriding the signal ON.

Similarly, signal LC may indicate that the load 111 is an open circuit. For example when the load 111 is a lamp, LC may indicate that the filament is fused. The threshold for LC may be chosen to be 5 percent or so of the nominal load current. Again, since this is not a fault which will ordinarily damage the MOST 100 output 148 is not connected to AND gate 126.

The intelligent power switch circuit of FIG. 4 also generates of a status output signal $\overline{STATUS}$ at output terminal 176. The fault condition signals HV, SC, OT, HC and LC are fed to NOR gate 152, and the output of the NOR gate 152 is level shifted by circuit 172 to produce a logic output signal $\overline{STATUS}$ at levels suitable for the external circuitry. The output terminal 176 is pulled low (towards GND) by circuit 172 when any one of the fault conditions is detected.

Of course, if a package with more than five pins were used for the circuit, or if the circuit were mounted as part of a larger, hybrid circuit, then the different fault conditions could be communicated separately, so that more detailed information would be available as to the nature of the fault.

FIGS. 5 to 12 show in detail parts of the circuit of FIG. 4, and like reference numerals will be used hereinafter to denote circuit elements corresponding to elements shown in FIG. 4.

Figure 5:
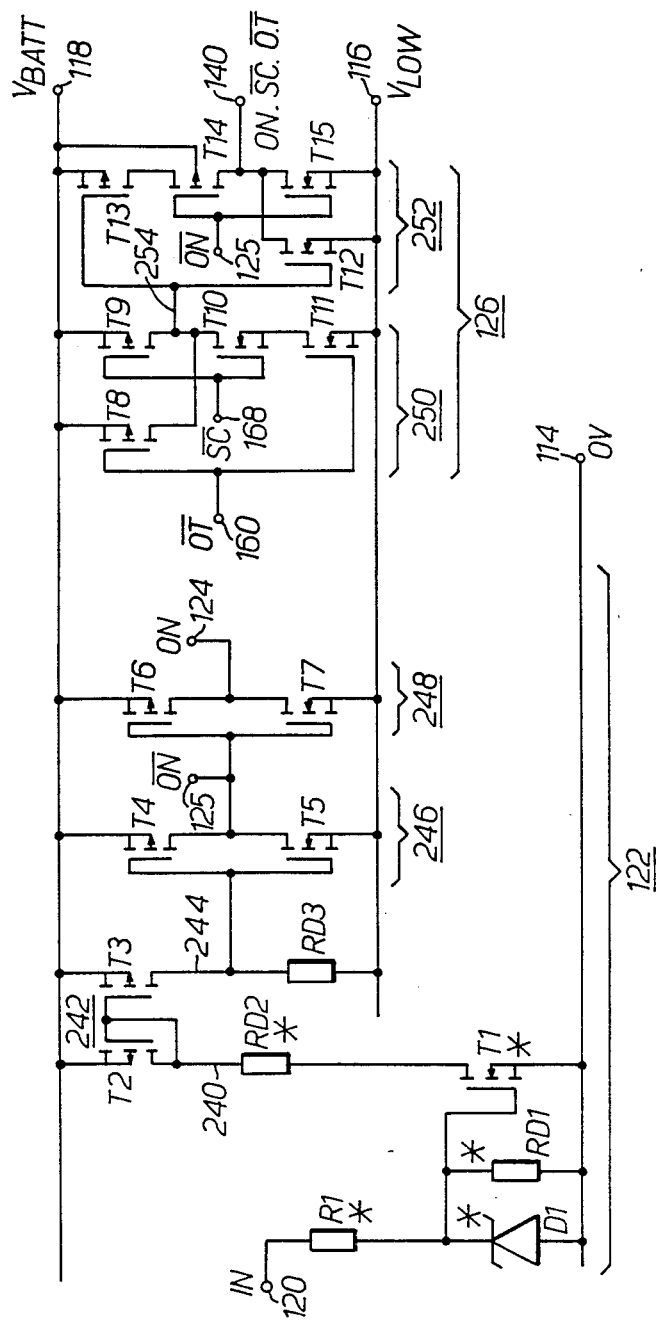
FIG. 5 shows a circuit suitable for use as a level shifter and logic circuit in the power switch of FIG. 4.

FIG. 5 shows the level shifting circuit 122 which has an input terminal 120 (IN) and supply terminals 114 (GND), 116 ($V_{LOW}$) and 118 ($V_{BATT}$). The circuit 122 comprises seven transistors T1-T7 and their associated components. A breakdown diode D1 has its anode connected to supply terminal 114 and its cathode connected via a resistor R1 to the terminal 120. A resistance device RD1 is connected in parallel with the diode D1. An n-channel transistor T1 has its gate connected to the cathode of diode D1 and its source connected to supply terminal 114. The drain of transistor T1 is connected via a resistance device RD2 to the input 240 of a current mirror circuit 242 which is formed by two p-channel transistors T2 and T3. T2 and T3 have their sources connected in common to supply terminal 118 ($V_{BATT}$). The output 244 of the current mirror 242 is connected to low-voltage supply terminal 116 ($V_{LOW}$) via a resistance RD3.

Transistors T4, T5, T6 and T7 form a pair of CMOS inverters 246 and 248. The input of inverter 246 is derived from the output 244 of current mirror 242, while its output is connected to an output terminal 125 (ON) and to the input of inverter 248. The output of inverter 248 is connected to a further output terminal 124 ($\overline{ON}$).

In operation, the level shifter 122 translates the ground-referenced input signal IN, applied to terminal 120 into a complementary pair of high-voltage referenced logic signals ON and $\overline{ON}$, which are available at outputs 124 and 125 respectively. Signal IN may employ TTL logic levels, with 0 V (GND) and 5 V for '0' and '1' respectively, or may employ the supply levels GND and $V_{BATT}$. In either case, resistors R1 and RD1 form a potential divider to reduce the level of signal IN to turn transistor T1 on or off when IN='1' or '0' respectively. Diode D1 acts as a protection device to limit the gate-source voltage applied to T1. The breakdown voltage chosen for D1 will depend on the process used to fabricate it, but may for example be around 12-14 V.

The choice of values for R1 and RD1 depend on the levels applied by the external circuit and the threshold voltage of T1. If the input levels are TTL compatible, for example, R1 will be required to be small in comparison with RD1. For convenience, resistance devices RD1-RD3 etc. may be fabricated as MOS devices. In a preferred embodiment, RD1-RD3 etc. are depletion-mode nMOS transistors with their gates and sources shorted together. Such devices can offer a resistance of several megohms, while taking up only a small area of substrate, and so are convenient for integrating with the very low power CMOS circuitry. If R1 is to have a much lower resistance than RD1, it may be constructed as a conventional resistor.

Similarly, RD2 and RD3 must have values chosen according to the input requirements of inverter 246. To ensure that T4 and T5 are turned fully on or off when required, RD3 may have a higher resistance than RD2.

Devices R1, RD1, D1, T1 and RD2 are constructed as high-voltage devices and each is marked on FIG. 5 with an asterisk ("*"). These devices operate from the external high-voltage supply, rather than the low voltage supply generated in accordance with the invention, and must be able to withstand the higher voltages applied to them. Devices not marked with an asterisk, on the other hand, are isolated by use of the invention from the high voltages, and may thus be constructed using conventional low-voltage technology.

It should hereby be understood that devices marked with an asterisk ("*") in all Figures referred to in this description are constructed as high-voltage devices.

The remainder of the circuit of FIG. 5 provides the AND gate 126 of FIG. 4, which in operation receives inputs, $\overline{OT}$ and $\overline{SC}$ from terminals 160 and 168 respectively and generates a signal (ON.$\overline{SC}$.$\overline{OT}$) at its output 140. In fact the AND function is performed by using a NAND circuit 250 and a NOR circuit 252, and by using signal $\overline{ON}$ from terminal 125, in place of signal ON. NAND circuit 250 has two inputs connected to terminals 160 and 168 and comprises four transistors T8-T11 in a conventional CMOS NAND arrangement. The output 254 of NAND circuit 250 is connected to a first input of a conventional CMOS NOR circuit 252, which comprises four transistors T12-T15 and has a second input connected to terminal 125 ($\overline{ON}$). The output of the NOR circuit 252 is connected to output terminal 140. The logic function represented at output 140 is thus $(\overline{(OT.SC)} + \overline{ON})$ which is functionally equivalent to the desired expression ON.$\overline{SC}$.$\overline{OT}$.

Of course this function could be performed by many different but equivalent logic circuits, but in CMOS technology it is more convenient to employ the NAND-NOR combination described than to construct an actual three-input AND circuit. As shown in FIG. 5, the logic circuits 246, 248, 250 and 252 all operate from the regulated supply between terminals 116 and 118, and may thus be constructed from low-voltage transistors.

Figure 6:
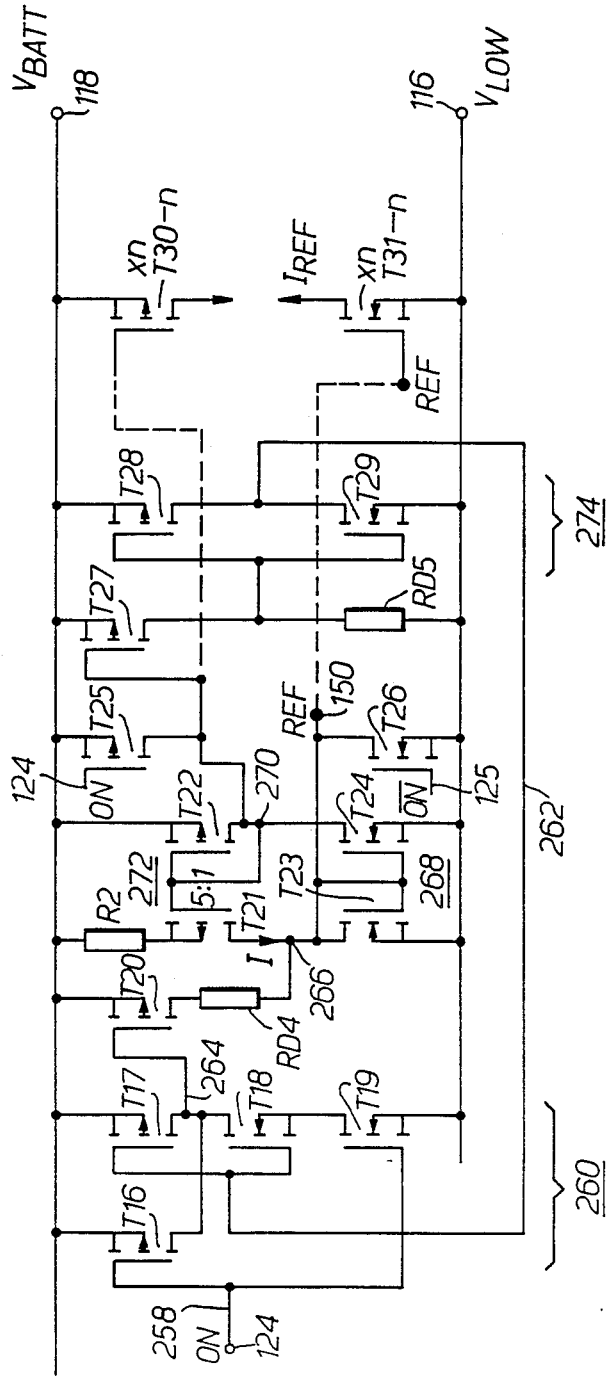
FIG. 6 shows a circuit suitable for use as a master current source in the circuit of FIG. 4.

FIG. 6 shows an embodiment of the master current source 154 which comprises a reference circuit source and associated logic. The master current source 154 is connected to the low-voltage supply terminals 116 ($V_{LOW}$) and 118 ($V_{BATT}$) and has an input 258 connected to terminal 124 (ON) and a reference output terminal 150 (REF).

A conventional CMOS two-input NAND gate 260 comprises four transistors T16-T19. One input of the NAND gate 260 is connected to input 258 while the other is connected to feedback line 262. The output 264 of the NAND gate 260 is connected to the gate of a p-channel transistor T20. Transistor T20 has its source connected to supply terminal 118 and its drain connected via a resistance RD4 to a node 266. The node 266 is connected to the input of a current mirror 268 which comprises n-channel transistors T23 and T24 having their sources connected to supply terminal 116 ($V_{LOW}$). The node 266 is also connected to output 150 (REF) and also via a transistor T26 to supply terminal 116 ($V_{LOW}$). The gate of transistor T26 is connected to terminal 125 ($\overline{ON}$). The drain of transistor T24 forms a first output of the current mirror and is connected to a further node 270. A current mirror 272 comprises p-channel transistors T21 and T22 and has its input connected to the node 270 and its output connected to the node 266. The source of transistor T22 is connected directly to terminal 118 ($V_{BATT}$), while that of T21 is connected to terminal 118 via a resistor R2.

The further node 270 is connected to terminal 118 via a transistor T25, which has its gate connected to terminal 124 (ON). The node 270 is also connected to the gate of a p-channel transistor T27 which has its source connected to terminal 118 ($V_{BATT}$) and its drain connected via a resistance RD5 to terminal 116 ($V_{LOW}$). The drain of T27 is connected to the input of a CMOS inverter 274 which comprises transistors T28 and T29. The output of inverter 274 is connected to the second input of NAND gate 260 via feedback line 262.

In operation, the two complementary current mirrors 268 and 272 find a stable operating current because of the degrading action of resistor R2 and form the reference current source. The current mirror 272 may have a scaling ratio different to unity to allow a convenient choice of value for R2. For example, T21 may be constructed, as shown in FIG. 6, to have five times the channel cross-sectional area that T22 has. In that case, at least when T21 is in weak inversion, the current I through T21 (and hence through T23) can be shown to be:

$I = 1/R.kT/q.\ln 5$ where R is the resistance of R2, k is Boltzmann's constant ($1.38 \times 10^{-23}$J/K), T is the absolute temperature in kelvin, q is the electronic charge ($1.6 \times 10^{-19}$ coulomb), and Ln5 is the natural logarithm of the scaling ratio of the current mirror 272.

The voltage at node 266 (output 150) which is the control voltage of current mirror 268 can then be used to generate a reference current proportional to I at any point in the circuit where it is required. To achieve this, the terminal 150 (REF) may be connected to the gate of an n-channel transistor such as that shown as T31-n, which will then pass a constant reference current $I_{REF}$ proportional to I. To generate a current in the opposite direction, a p-channel transistor such as that shown as T30-n may be used, with its gate connected to node 270.

The transistors T25 and T26 are provided simply to reduce current consumption when the MOST 100 is in the 'off' condition. T25 and T26 conduct when ON='0' and so disable the current mirrors 268 and 272 The logic circuits 260 and 274 are provided to restart the current source when the MOST 100 is turned on again. When signal ON goes to '1', the NAND gate output 264 goes low, turning on transistor T20 which produces an initial input current for current mirror 268. Once current flows through T24, and hence through T22, then T27 will pass a corresponding current and pull up the input of the inverter 274. The output of inverter 274 will thus go to '0' ($V_{LOW}$) and feed back to the NAND gate 260 via line 262. This causes the NAND output 264 to go to '1' ($V_{BATT}$) and so T20 is turned off again as soon as the operation of the reference current source has been initiated, leaving it to settle into its equilibrium state.

Figure 7:
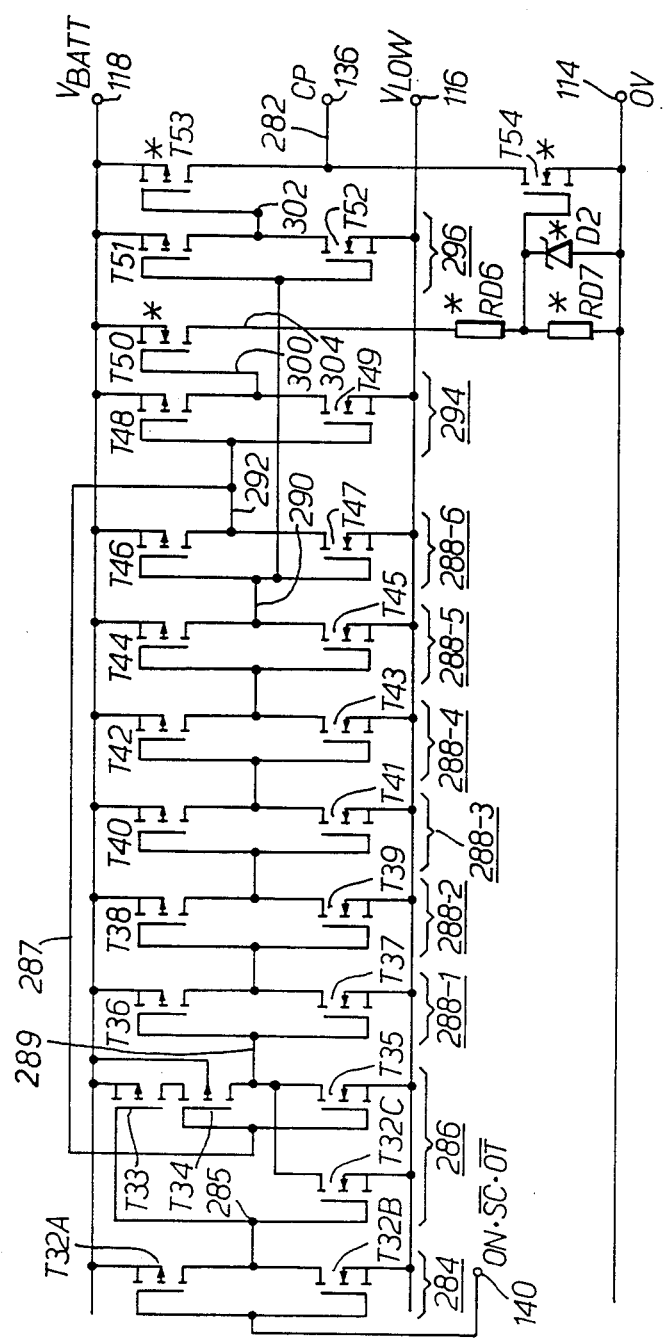
FIG. 7 shows a circuit suitable for use as a charge pump oscillator in the circuit of FIG. 4.

FIG. 7 shows an embodiment of the charge pump oscillator 138 of FIG. 4. The charge pump oscillator 138 has a gating input 139 which is connected to terminal 140 (logic signal ON.$\overline{SC}$.$\overline{OT}$). The oscillator 138 is connected to supply terminals 114 (GND), 116 ($V_{LOW}$) and 118 ($V_{BATT}$) and has an output 282 connected to terminal 136 (CP).

Input 280 is connected to the input of a CMOS inverter 284, which comprises two transistors T32A and T32B. The output 285 of the inverter 284 is connected to one input of a CMOS NOR circuit 286, which comprises four transistors T32C, T33–T35. The second input of NOR circuit 286 is connected to a feedback line 287. The output 289 of NOR circuit 286 is connected to the input of CMOS inverter 288-1, which is the first in a cascaded series of six inverters 288-1 to 288-6. These six inverters comprise a total of twelve transistors T36–T47. The output of inverter 288-6 is connected via line 287 to the second input of NOR circuit 286. The circuit shown in FIG. 7 as described so far forms a gated ring oscillator. When gating input 280 is high (ON.$\overline{SC}$.$\overline{OT}$='1'), then NOR circuit 286 acts as one inverter in a loop of seven inverters, the loop comprising NOR 286, the inverters 288-1 to 288-6 and the feedback line 287. Because of the finite propogation delay through each of the seven inverters, each node within the loop oscillates between '0' and '1' at a frequency depending on the total propagation delay around the loop. A different number of inverters could be used provided that the signal undergoes an odd number of inversions in each complete loop. When input 280 is low (ON.$\overline{SCT}$/='0') then the output 289 of the NOR circuit 286 is held at '0' ($V_{LOW}$) and oscillation can no longer occur. In this condition, the output 290 of inverter 288-5 is at '1', while the output 292 of inverter 288-6 is at '0'.

The remainder of the circuit serves to change the levels of the oscillator output signal from the low-voltage logic levels, $V_{BATT}$ and $V_{LOW}$, to the high voltage levels $V_{BATT}$ and OV(GND) required at the output 282. Two CMOS inverters 294 and 296 comprise pairs of transistors T48–T49 and T51–T52. The inverters 294 and 296 have their inputs connected to the output 292 and input 290 of inverter 288-6 respectively.

The output 300 of inverter 294 is connected to the gate of a high-voltage p-channel transistor T50, whose source is connected to terminal 118($V_{BATT}$). The drain 304 of T50 is connected to one end of a resistance device RD6. The other end of resistance RD6 is connected via a further resistance RD7 to terminal 114 (GND), thus forming a potential divider. A breakdown diode D2 is connected in parallel with RD7. Complementary high-voltage transistors T53 and T54 form a push-pull output arrangement, with their sources connected to terminals 118 and 114 respectively, and their drains connected to output 282 (CP). The gate of the n-channel output transistor T54 is connected to the junction of RD6 and RD7. The p-channel output transistor T53 has its gate connected directly to the output 302 of inverter 296.

The components RD6, RD7 and D2 act as a level shifting circuit similar to that circuit described previously with reference to FIG. 5. The diode D2 limits the gate-source voltage applied to T54. Transistors T48–T54 and RD6, RD7 and D2 thus act to provide a high-voltage push-pull output stage for the gated oscillator.

In operation, output signal CP is held high ($V_{BATT}$) when input signal (ON.$\overline{SCT}$/) is '0' ($V_{LOW}$), but oscillates at high frequency between ($V_{BATT}$) and OV(GND) when signal (ON.$\overline{SCT}$/) is '1'. It is preferable to hold CP low when the switch is in the 'off' state (ON.$\overline{SCT}$/='0'), because if CP were high, the current through the potential divider RD6, RD7 would place an unnecessary drain on the power supply. In all circuits described herein, current consumption in the 'off' state is minimized because in motor vehicles for example the power supply is a battery which must remain charged over perhaps weeks of disuse.

Figure 8:
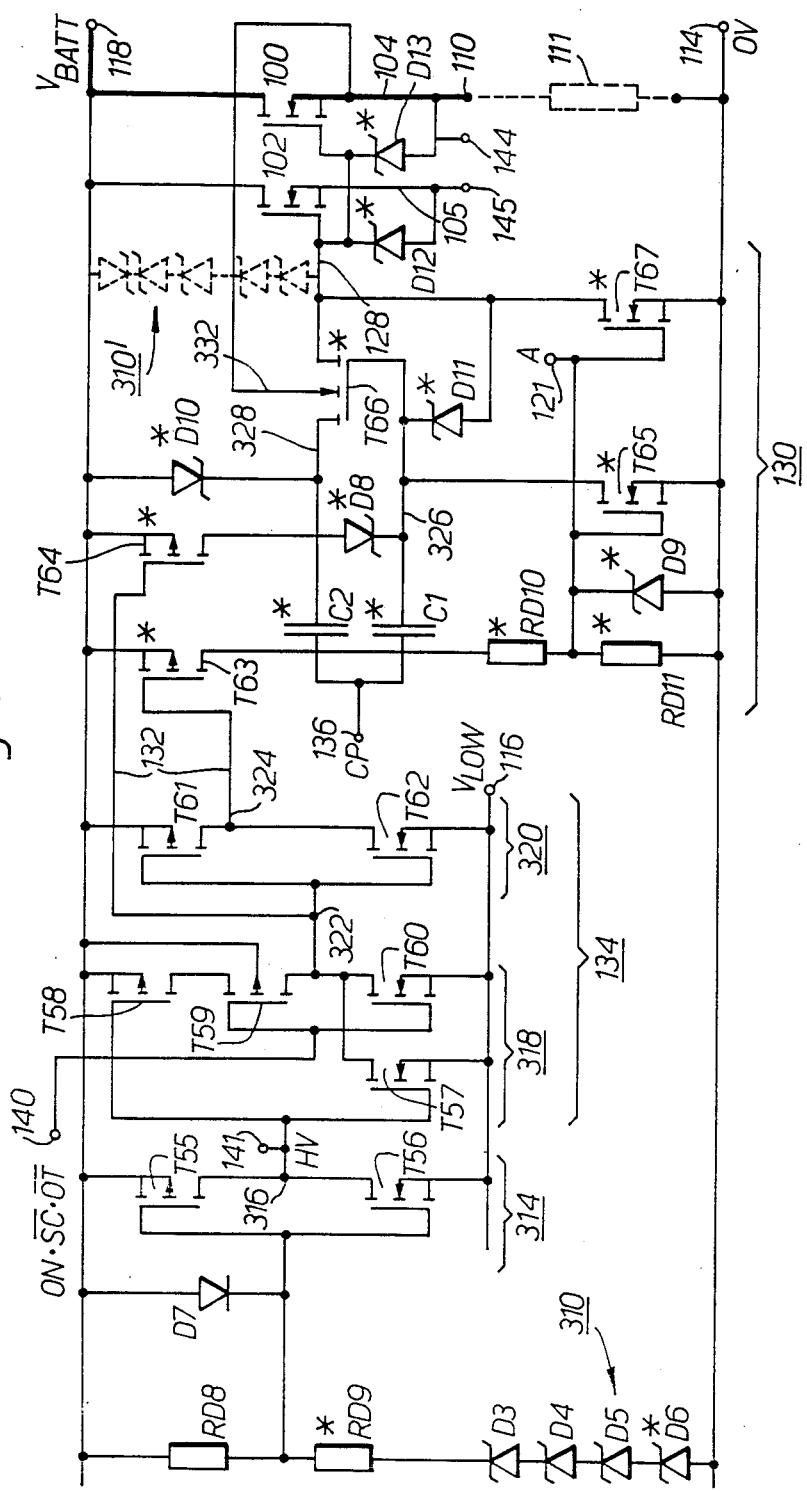
FIG. 8 shows a circuit embodying circuits suitable for use as a charge pump high voltage detection circuit and logic circuit in the circuit of FIG. 4.

FIG. 8 shows a charge pump circuit 130 connected to power MOST 100 and its associated sense cell 102, as described hereinbefore with reference to FIG. 4. The circuit of FIG. 8 also includes a high voltage detection circuit 143 and OR gate.

The circuit is connected to supply terminals 114 (GND), 116 ($V_{LOW}$) and 118 ($V_{BATT}$), and has inputs connected to terminals 136 (CP) and 140 (ON.$\overline{SCT}$/). The circuit also has outputs connected to terminals 141 (HV) and 121 (A) and via the power MOST 100/102 to terminals 110, 144 and 145. A load 111 is shown dotted, connected between output terminal 110 and supply terminal 114.

The high voltage detection circuit 143 comprises a breakdown arrangement 310 comprising four breakdown diodes D3–D6 connected in series, with the anode of D6 connected to supply terminal 114. The cathode of D3 is connected to one end of a resistance device RD9, the other end of which is connected to supply terminal 118 via a further resistance device RD8. A breakdown diode D7 is connected in parallel with RD8, with its cathode connected to supply terminal 118 and its anode connected to the junction 312 of RD8 and RD9. The junction 312 of resistances RD8 and RD9 is further connected to the input of a CMOS inverter 314, which comprises two low voltage transistors T55 and T56. The output 316 of the inverter 314 is connected to output terminal 141 (HV). In normal operation, input 312 of the inverter 314 is held high by RD8 since the voltage across the reverse-biassed diodes D3–D6 is not sufficient to cause breakdown. Thus output terminal 141 carries a signal HV='0' to indicate normal operation. If, however, an excessively high voltage transient occurs across supply terminals 114 and 118, diodes D3–D6 will break down and the input 312 of the inverter 314 will be pulled low because of the low breakdown resistance of the diodes D3–D6. Thus, during high-voltage transients or 'spikes' on the voltage supply, a signal HV='1' is provided at terminal 141. Diode D7 serves to limit the voltage applied to the input of the inverter 314 during spikes, to avoid damage to the transistors T55 and T56.

Clearly, the threshold value of the supply voltage $V_{BATT}$ which will cause the breakdown arrangement 310 to break down will depend on the number of diodes employed in series and the breakdown voltage of each one. The diodes D3–D7 may be zener or avalanche breakdown diodes, and the series chain D3–D6 could be replaced by a chain of fewer or more diodes to achieve the desired threshold voltage. With four diodes as shown, the detected threshold for $V_{BATT}$ may be around 50 volts if the diodes D3–D6 each have a breakdown voltage of around 12 volts. Similarly, if D7 has a breakdown voltage of around 12 volts, and if $V_{LOW}$ is regulated so that $(V_{BATT} - V_{LOW}) = 12$ volts, then diode D7 will limit the input to the low-voltage inverter circuit 314 to be substantially within the range of the low-voltage supply.

A logical-OR gate 134 is made up of a two-input CMOS NOR gate 318, comprising four transistors T57–T60, and a CMOS inverter 320, comprising two transistors T61 and T62. These CMOS circuits are connected to supply terminals 116 ($V_{LOW}$) and 118 ($V_{BATT}$). One input of the NOR gate 318 is connected to terminal 140 while the other input is connected to terminal 141, the output of the high voltage detection circuit 143. The output 322 of NOR gate 318 is connected to the input of the inverter 320, whose output 324 forms the output of the OR gate 134.

In operation, the logical-OR combination of signals HV and (ON.$\overline{SCT}$/ ) is available at line 324. Also, the complementary signal, the NOR combination, is available at line 322.

Charge pump circuit 130 includes two high-voltage p-channel transistors T63 and T64. The sources of T63 and T64 are connected to supply terminal 118 ($V_{BATT}$), and their gates form a pair of inputs which together form the gating input 132 shown in FIG. 4. The gate of T63 is connected to the output 324 of OR gate 320, while the gate of T64 is connected to the complementary (NOR) output 322 of OR gate 134.

Input terminal 136 (CP) is connected to one plate of each of two capacitors C1, C2, which may be integrated in a known fashion with the other components of the circuit. The other plate of capacitor C1 is connected at 326 to the cathode of a diode D8, and also to the drain of an n-channel high voltage transistor T65. The anode of diode D8 is connected to the drain of transistor T64. The other plate of capacitor C2 is connected at 328 to the cathode of a diode D10, whose anode is connected to supply terminal 118 ($V_{BATT}$).

The drain of p-channel transistor T63 is connected to one end of a resistance device RD10, which forms the input of a potential divider, comprising RD10 and another resistance device RD11. The junction between RD10 and RD11 forms the output line 330 of the potential divider, while the other end of RD11 is connected to terminal 114 (GND). Line 330 is also connected to the cathode of a breakdown diode D9, the gate of transistor T65, the gate of another high voltage n-channel transistor T67 and to output terminal 121(A). The anode of D9 and the sources of transistors T65 and T67 are connected to supply terminal 114 (GND). The drain of transistor T67 is connected at 128 to the gate of power MOST 100 and associated sensing cell 102. A further high-voltage n-channel transistor T66 has its gate connected to capacitor C1 at 326, its drain connected to capacitor C2 at 328, and its source connected to the gate of the power MOST 100/102 at 128. In this embodiment, the transistor T66 has a separate back-gate electrode 332 which is connected to the source 104 of power MOST 100. A breakdown diode D11 is connected between the gate and source of transistor T66, with its anode connected to the source, while another breakdown diode D12 is connected similarly between the gate 128 and source 105 of the sensing cell 102, and yet another breakdown diode D13 is connected similarly between gate 128 and source 104 of the power MOST 100.

In operation, the signal at 324 and its complement at 322 determine whether the desired state of the power MOST 100/102 is 'on' (conducting) or 'off' (not conducting). In the 'on' state, when ON.$\overline{SCT}$/ = '1', then the OR signal at 324 is high and the NOR signal at 322 is low, with reference to the low voltage supply at terminals 116 ($V_{LOW}$) and 118 ($V_{BATT}$). Thus, T64 conducts to apply $V_{BATT}$ to the anode of D8 and T63 does not conduct. The potential divider RD10/RD11 acts as a level shifting circuit to enable the signal at 324 to control high-voltage transistors T65 and T67, and so in the 'ON' state, T65 and T67 do not conduct. At the same time, terminal 136 (CP) which is connected to an oscillator such as that described previously with reference to FIG. 7, oscillates at high frequency between two voltages determined by the output of the oscillator circuit. Using the circuit of FIG. 7, for example, CP oscillates substantially between the supply voltages $V_{BATT}$ and 0V (GND), to give the maximum available output swing, but if a smaller signal were desired, it might for example be derived from the output 300 of the inverter 294 (FIG. 7), and the high-voltage output stage would no longer be required. The choice of voltage for CP depends upon the particular voltage required at the gate 128 of the power MOST 100 for hard turn-on of that transistor.

When the oscillation takes CP (at 136) low, to GND for example, both C1 and C2 charge via their respective diodes D8, D10, until they carry substantially the full supply voltage, minus the drop across the components in series with them. When CP goes high again C1 and C2 cannot discharge through the diodes D8 and D10, which become reverse-biassed as the voltages at 326 and 328 rise to a level above $V_{BATT}$. The charge on C1 is then shared with the gate capacitance of transistor T66, which is thus turned on, and the charge on C2 can then flow through T66 and is shared with the gate capacitance of the power MOST 100/102. This process repeats for each cycle of the input CP, until after some number of oscillations, the gate 128 of power MOST 100/102 is held at a voltage $V_G$ which is several volts above $V_{BATT}$, thereby achieving hard turn-on of the power MOST 100/102. The ultimate value of $V_G$ is given approximately by the formula:

$$V_G = \Delta V_{CP} - V_{BE} - V_{TH},$$

where $\Delta V_{CP}$ is the peak to peak amplitude of the oscillations of the signal CP, $V_{BE}$ represents the forward voltage drop across the diode D10 and $V_{TH}$ is the voltage drop across the transistor T66 when it is turned on. It should be noted that if, for convenience in manufacture or for some other reason, the diode D10 is constructed as a breakdown diode, the value of $V_G$ achievable will be limited by the breakdown voltage of that diode. The gate 128 is prevented from discharging again during the time when CP is low, because of the action of T66, which thus acts as a synchronous rectifier.

By suitable choice of values for capacitors C1 and C2 and the frequency of oscillation of the signal CP, the rate at which the load is turned on can be controlled. It may be desirable to energize a load such as a filament lamp slowly, to avoid a large 'inrush' current when the filament is cold. Such currents are potentially damaging, for example to thin wires bonded to the integrated circuit for connection to the load.

The connection of the back-gate region of transistor T66 to the source 104 of the power MOST 100, rather than to the source of T66 itself or to GND, is particularly advantageous when the transistor T66 is integrated without isolation from the power MOST 100/102, because the n-type substrate in which T66 is formed is connected to $V_{BATT}$. If the p-type well region forming the body region (back-gate 332) of T66 were shorted to the source of T66 in the conventional manner, the source of T66, and hence the gate 128 of power MOST 100/102 would be prevented from rising above $V_{BATT}$ as required, because the p-n junction between the back gate 332 and the substrate would then be forward biassed. To avoid this problem, the back gate 332 could be tied to some fixed reference voltage, such as GND, but whatever voltage was chosen, this would apply an excessive back-bias to T66 at some stage or other in the operation, so that the effectiveness of the circuit would be impaired, and T66 would need to be constructed to withstand such high back-bias without breakdown.

The connection of the back gate 332 as shown in FIG. 8 enables simple integration to be achieved, and T66 always has a small back-bias voltage applied because when, during operation, the MOST 100 is turned on the source 104 of MOST 100 rises along with its gate 128, at least almost to $V_{BATT}$. Further, high voltage spikes on the supply $V_{BATT}$ are not a danger to T66 because its electrodes all rise simultaneously with each spike.

Another advantage gained by connecting the back-gate 332 of T66 to the source of the output device is that the p-n junction described above is then connected so as to act as diode D13, so that D13 need not be separately provided. Diodes D12 and D13 are zener or avalanche breakdown diodes and serve to limit the gate-source voltage applied to MOST 100/102. Breakdown diode D11 performs the identical function for T66. The breakdown voltage of these diodes is a matter for choice, but integrated diodes may conveniently be formed at the same time as the MOS transistors having breakdown voltages of 12 to 14 volts. Diodes D8 and D10 are not required to act as breakdown diodes, but in one embodiment they are breakdown diodes as shown and are identical to the other diodes, for convenience in manufacture.

In the 'off' state, when input 140 goes low (and assuming HV='0' for the moment), then T63 is turned on and T64 is turned off and input CP at 136 does not oscillate but remains high. Thus diode D8 is disconnected from $V_{BATT}$ and transistors T65 and T67 are turned on via the level shifter circuit RD10–RD11–D9. The breakdown diode D9 serves to limit the gate-source voltage applied to T65 and T67 at times of excessive supply voltage $V_{BATT}$. Thus, the gate of T66 is pulled toward GND, and T66 turns off, disconnecting the gate 128 of the power MOST 100/102 from the supply, so turning off the MOST 100 and de-energizing the load 111.

Transistor T67 is provided because the gate capacitance of the large-area power MOST 100/102 is very large and requires an active pull-down to achieve fast turn-off. The transistor T67 may be constructed with twice the channel cross-section of the normal transistors, so that it has particularly low on-resistance.

The signal at 330 is output as signal A at terminal 121 for use in other parts of the circuit, for example as described hereinafter with reference to FIG. 9. It provides a logic indication of the on/off state of the power switch, but at voltage levels suitable for the ground-referenced parts of the circuit. Signal A is low when the switch is 'on', and high when it is 'off', in contrast to signal IN. Signal A of course also incorporates the fault signals SC, OT and HV, but this in unimportant since signal A is used only to activate power conservation features in the 'off' state.

Of course, the circuit of FIG. 8 will not only be in the 'off' state when ON='0': short-circuit and over-temperature signals SC and OT can override the signal ON='1' and shut down the charge pump and oscillator to avoid damage to the power MOST 100.

Conversely, signal HVO'1', generated by circuit 143 in response to spikes in the voltage supply $V_{BATT}$, can override the signal ON.$\overline{SCT}$/ ='0', as described hereinbefore with reference to FIG. 4. Signal HV does not activate the charge pump oscillator 138, however, because the time the charge pump would take too long for it to be of use in immediate response to a spike.

In the 'off' state, then, when ON.$\overline{SCT}$/ ='0', if the circuit 143 detects a high-voltage spike and generates a signal HV='1' at its output 316, then the NOR output 322 changes from '1' to '0' for the duration of the spike, so turning on transistor T64. Similarly, the OR output 324 changes from '0' to '1' for the duration of the spike, and T63 is turned off. Although the charge pump circuit 130 is unable to drive the gate 128 of the power MOST 100/102 to a voltage above $V_{BATT}$ when the oscillator is not running, transistor T66 is still turned on by T64 sufficiently for it to draw gate 128 at least towards $V_{BATT}$, via diode D10 and so turn-on MOST 100/102 at least partially. At the same time, of course, transistor T63 turns off transistors T65 and T67, to remove the connection to GND from the gates of transistor T66 and MOST 100/102 respectively. By turning the power MOST 100/102 on in the event of a spike, the voltage of the spike is dropped substantially across the load. Otherwise, in the 'off' state, MOST 100 would bear the full voltage of such spikes, and suffer possible damage from dissipation of energy in the semiconductor if the MOST breaks down.

Alternatively, or in addition to the circuit technique for high-voltage protection described hereinbefore, a chain of breakdown diodes similar to arrangement 310 may be connected directly between the gate 128 of the power MOST 100/102 and the supply terminal 118 ($V_{BATT}$). A breakdown arrangement 310', shown dotted in FIG. 8, includes such a chain of diodes, and also an additional diode connected in series with the opposite sense to the four diodes in that chain. If the MOST 100 is off and a high voltage transient occurs on the supply $V_{BATT}$, the chain of breakdown diodes breaks down and connects the gate 128 immediately to $V_{BATT}$. This provides a faster response than the circuit without arrangement 310', but has the disadvantage that, during breakdown, a very large current flows through the pull-down transistor T67, which is turned on when the MOST 100 is in the off state. Also, the breakdown arrangement will only conduct to the extent that it limits the voltage at the gate 128 to be no more than approximately 50V during a spike. This means that with only the arrangement 310' provided, a substantial power dissipation can still occur in the power MOST as a result of the transient current.

To mitigate these problems, the detection circuit 143 is also provided as described hereinbefore, so that the high current only flows through T67 for a short period of time while the signal HV=1 is generated and propagates through the OR gate 134 and level shifter to turn off T67 and turn on T66. The period of time involved may be only of the order of a few tens of nanoseconds. If the circuit 143 is omitted, for economy of space for example, then it may be necessary to protect transistor T67 by making it have a relatively high on-resistance thereby limiting the current that can flow during breakdown. This solution has the disadvantage that T67 is then less able to turn-off the MOST 100/102 quickly. The additional diode opposed to the series chain within the arrangement 310' is provided to block undesirable forward conduction through the arrangement 310' when the gate 128 of the MOST 100/102 is driven above $V_{BATT}$ by the charge pump circuit 130, in the "on" state.

It should be noted that where the circuit described in the preceding two paragraphs is used to protect the power device against positive-going spikes on the supply (where $V_{BATT}$ itself is positive, the power MOST 100/102 is also protected against negative-going spikes, and indeed against inadvertent reverse-polarity connection of the supply. This protection arises for power MOSFETs, for example the MOSFET 1' of FIGS. 2A and 2B, because under reverse-supply conditions the pn junction between the drain region 15' and the body region 18b' of the MOSFET 1' becomes forward biassed, and the negative voltage is taken entirely across the load 7', just as in the case of a positive-going spike. This p-n junction may also be of use as a flywheel diode when driving inductive loads. It will be apparent that such an inherent immunity to a reverse-polarity supply is due to a feature of MOSFET construction, and immunity may not be inherent in, say bipolar power devices.

Figure 9:
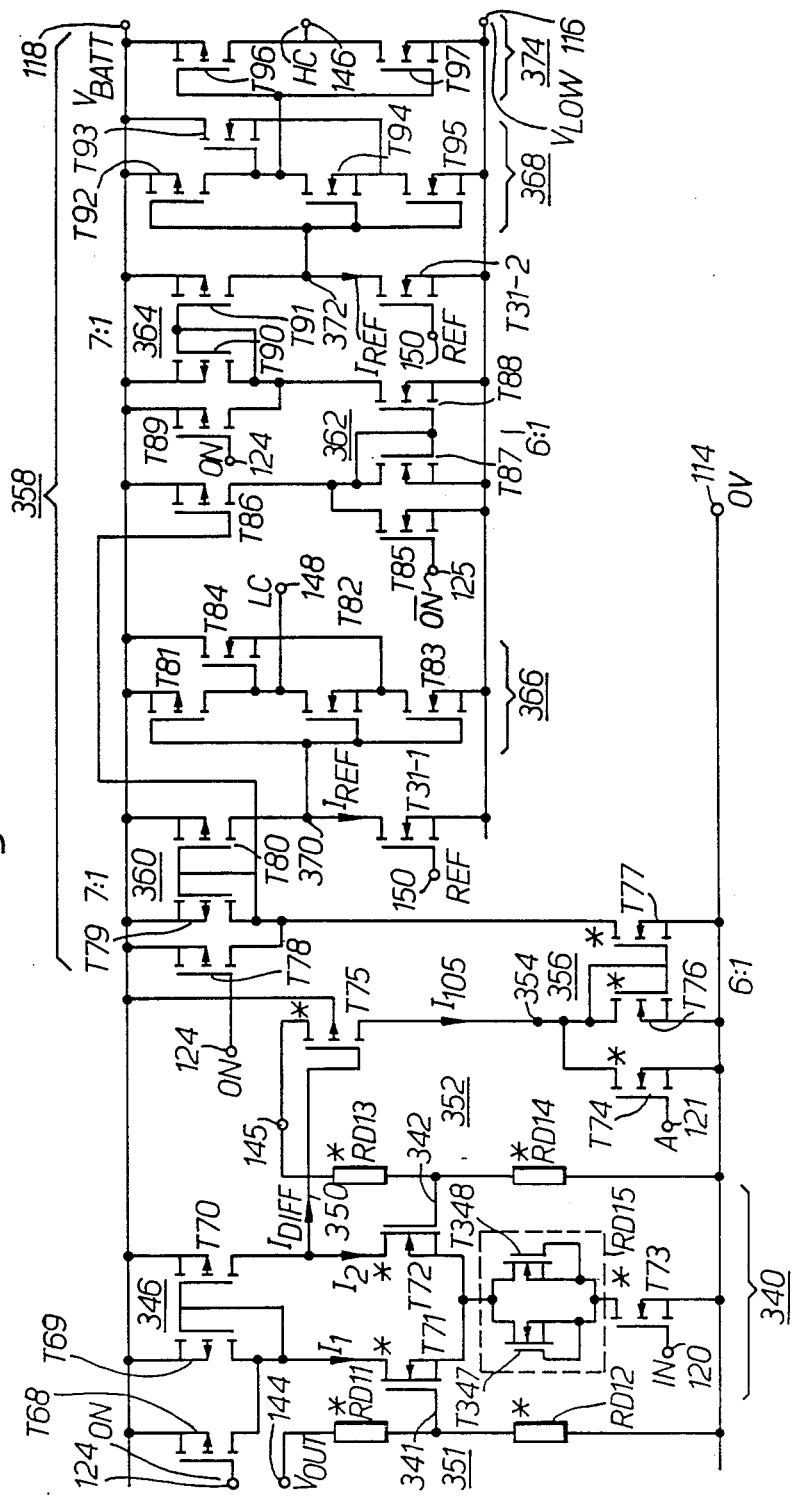
FIG. 9 shows a circuit suitable for use as a current sensing circuit in the circuit of FIG. 4.

FIG. 9 shows a current sensing circuit suitable for use in the intelligent power switch circuit of FIG. 4. A differential amplifier 340 has first and second inputs 341 and 342, which are connected respectively to the gates of first and second depletion-mode transistors T71 and T72. In this exemplary embodiment, the transistors T71 and T72 are n-channel metal-oxide-semiconductor field effect transistors (MOSFETs), but it will be apparent from the description which follows that other devices may have characteristics suitable for implementing the differential amplifier 340.

The sources of MOSFETs T71 and T72 are connected in common to a first terminal 343 of a resistance device RD15, thereby forming a "long-tail pair" arrangement. Resistance device RD15 has a second terminal 344 connected to the drain of a MOS transistor T73 which has its source connected to terminal 114 (GND) and its gate connected to terminal 120 (IN).

Two p-channel MOSFETs T69 and T70 are connected so as to form a current mirror circuit 346. The gate of transistor T69 is connected to its drain and forms the input of the current mirror 346 and is connected to the drain of transistor T71. The gate of transistor T70 is connected to the gate and drain of transistor T69. The sources of transistors T69 and T70 are both connected to the high-voltage supply terminal 118. The drain of transistor T70 forms the output of the current mirror 346 and is connected to the drain of transistor T72 and forms an output 350 of the differential amplifier 340. A p-channel transistor T68 is connected in parallel with T69 and has its gate connected to terminal 124 (ON).

Resistance device RD15 comprises two n-channel depletion-mode MOSFETs T347 and T348, connected in parallel between terminals 343 and 344. The gate and source of each transistor T347 and T348 are directly connected together. In operation, the transistors T71, T72, T347 and T348 are biassed into saturation. They thus act as substantially constant current sources, but modulated by their gate-source voltages, $V_{GS}$. Because the currents in the input and output of the current mirror 346 are constrained to be equal, the output current $I_{DIFF}$ is given by the equation:

$$I_{DIFF} = I_1 - I_2$$

where $I_1$ is the current through transistor T71 and $I_2$ is the current through transistor T72 and current $I_{DIFF}$ flows along path 350.

$I_{DIFF}$ is therefore controlled by a differential input voltage signal applied across inputs 341 and 342 to the gates of transistors T71 and T72. To improve performance, and particularly common-mode rejection, transistors T71 and T72 are matched. This can conveniently be achieved by simultaneous integration of both transistors on a common substrate using identical geometries. In this way, both transistors are subject to identical process and temperature variations, and should therefore perform identically.

However, it is known that matched depletion-mode MOSFETs have their transfer characteristics most accurately matched only around the curve $V_{GS}=0V$. To confine the operation of transistors T71 and T72 to this advantageous operating curve the transistors T347 and T348 are also matched to one another and matched to transistors T71 and T72, by integrating them in close proximity. The direct gate-source connection of transistors T347 and T348 defines $V_{GS}=0$ for each and thus defines the drain current of each to be $I_{DSS}$. Thus the device RD15 acts as a substantially constant current source, and the total bias current $I_S$ is given by $$I_S = I_1 + I_2 = 2 \times I_{DSS}$$

So, for zero differential input, which is usually a good approximation in negative feedback applications, then $I_1 = I_2$. Consequently the current through each of transistors T71 and T72 is $I_{DSS}$, and so their gate-source voltage is zero.

Such a biassing scheme has the added advantage of remaining optimally matched despite variations in operating conditions, such as process and temperature changes, because the matched transistors T71, T72, T347 and T348 all behave identically in response to such changes.

Input terminals 144 and 145 are provided for connection to the source 104 of the MOST 100 and the source 105 of the sensing cell 102 respectively as shown in FIG. 4. Terminals 144 and 145 are coupled to input terminals 341 and 342 respectively of the differential amplifier 340 by means of two potential dividers 351 and 352. Divider 351 (and similarly divider 352) comprises a pair of resistance devices RD11 and RD12 (RD13 and RD14). In an exemplary embodiment, suitable for construction as an integrated circuit, the devices RD11–RD14 are MOS devices, such as depletion-mode MOSFETs having their gate and source electrodes connected in a similar fashion to MOSFETs T347 and T348. The respective division ratios of dividers 351 and 352 are made equal by suitable design of devices RD11–RD14. One end of each of devices RD12 and RD14 is connected to supply rail 114 (GND).

A p-channel MOSFET T75 has its source connected to terminal 145 and its gate connected to the output 350 of the amplifier 340. The drain of MOSFET T75 is connected to the input 354 of a current mirror 356 comprising n-channel MOSFETs T76 and T71, which forms the input of a current measuring circuit 358. The operation of current measuring circuit 358, will be described hereinafter.

As in the other Figures, all devices marked with an asterisk ("*") throughout the drawings are constructed as high voltage devices. Other parts of the circuit, such as current mirror 346 and the current measuring circuit 358, may be constructed using conventional low-voltage CMOS devices, because of the provision of the high-voltage-referenced low-voltage supply rail 116 ($V_{LOW}$).

When the power MOST 100/102 is turned on (e.g. to light a headlamp) the voltages at terminals 144 and 145 rise almost to $V_{BATT}$. The potential dividers 351 and 352 drop these voltages to levels suitable for applying to the inputs 341 and 342 of the differential amplifier 340. There must be sufficient voltage difference between each input 341, 342 and $V_{BATT}$ to allow the MOSFETs T69 and T70 of the current mirror 346 to enter saturation. The differential amplifier 340 can thus operate to compare the voltages at terminals 144 and 145 as described hereinbefore, and the output current $I_{DIFF}$ of the amplifier 340 is generated according to the difference in voltage between terminals 144 and 145 $I_{DIFF}$ charges or discharges the gate effective capacitance of transistor T75 and thus controls the gate voltage of transistor T75, which in turn controls the current $I_{105}$ via terminal 145 drawn from the sense cell 102 of the power MOST 100/102 (shown in FIG. 4).

In the current measuring circuit 358 current mirror 356, comprising transistors T76 and T77, reproduces the measuring current $I_{105}$, and scales it by a predetermined ratio 1:n. Scaling is achieved in a well-known manner by constructing transistors T76 and T77 so as to have different channel dimensions. The measuring circuit 358 further includes current mirrors 360, 362 and 364, comprising transistors T79–T80, T87–T88, and T90–T91 respectively, and each having its own predetermined scaling ratio which may be chosen individually as desired. The circuit 358 further includes Schmitt trigger circuits 366 and 368, which each comprise four transistors T81–T84 and T92–T95 respectively.

Reference current sources are provided in the form of transistors T31-1 and T31-2, which are typically both output transistors of a current reference circuit such as the master current source circuit 154 shown in FIG. 4. The gates of T31-1 and T-31-2 are connected via terminal 150 (REF) to a master current source such as that described previously with reference to FIG. 6. Each transistor operates to pass a reference current $I_{REF}$, which is shown as equal for both transistors T31-1 and T31-2. These reference currents could be made different, if desired, by use of different scaling ratios in the transistors T31-1 and T31-2. In this embodiment, however, the use of scaling current mirrors 356, 360, 362 and 364 allows two different thresholds to be detected by use of the single reference current $I_{REF}$, as explained hereinafter.

At node 370, current $I_{REF}$ is subtracted from the scaled replica of measuring current $I_{105}$ generated by current mirror 360. If, however, the scaled $I_{105}$ is less than $I_{REF}$, positive charge flows into the input of Schmitt trigger 366, turning on transistors T82 and T83 while turning off transistor T81 so that the signal LC at output terminal 148 is low (logic '0'). If, however, the scaled current $I_{105}$ is less than $I_{REF}$, then the situation is reversed and LC='1'. Output LC therefore takes a logic value '1' when the current being switched $I_{104}$ is below a certain threshold, which threshold is simply determined as the product of the ratios $I_{105}:I_{104}$, and 1:n for each current mirror 356, 360, multiplied by the reference current $I_{REF}$. Transistor T84 generates the hysteresis action of the Schmitt trigger 346 in a known fashion. Hysteresis improves noise immunity and eliminates spurious oscillation in threshold detection circuits.

Transistor T86 provides a second output for current mirror 360, and hence a second scaled replica of measuring current $I_{105}$. The scaling ratio 1:n for this second output transistor T86 is the same as that for the first output transistor T80, but clearly could have any desired ratio. The second scaled replica of current $I_{105}$ is further scaled by current mirrors 362 and 364 and passed to anode 372. At node 372, current $I_{REF}$ is subtracted from this further scaled replica of $I_{105}$. If the further scaled $I_{105}$ is greater than $I_{REF}$, positive charge flows into the input of Schmitt trigger 368, turning on transistors T94 and T95 while turning off transistor T92. Transistor T93 provides a hysteresis characteristic similarly to transistor T84 in trigger circuit 366. The output of trigger 368 drives transistors T96 and T97, which form a simple CMOS inverter circuit 374, driving output terminal 146 to generate signal 'HC'. Because of the inverter 374, output HC takes a value '1' when $I_{104}$ is higher than the appropriate threshold.

By suitable choice of $I_{REF}$ and of the ratios 1:n for all the current mirror circuits, LC='1' may signal to an external circuit that the load current is too low, perhaps as a result of a fused lamp, while HC='1' may signal that the load current is too high. HC could be used by another circuit to shut off the power arrangement automatically in the event of a short circuit until the fault is cleared, but in this application is only used to detect a less severe high current situation.

For example, in one particular embodiment, the output current current of current mirrors 362 and 364 are one sixth and one seventh respectively of their input currents. Consequently the threshold value of $I_{105}$ (and hence of $I_{104}$) being detected at node 372 is approximately forty times that detected by the Schmitt trigger 366 at 370. Thus, if the low current threshold at node 92 which indicates an open circuit corresponds to 5 per cent of the nominal load current, then the current threshold at node 92 which indicates an excessive load current will correspond to twice the nominal load current. For these exemplary values, for a nominal load circuit of 6A and where $I_{LOAD}:I_{CELL}$ is 8000:1, the required reference current $I_{REF}$ will be approximately 0.9 microamp.

Clearly, any number of replicas of the measuring current may be provided, for example to detect many different threshold levels, or perhaps to provide an analog display of current. Analog feedback to the power transistor could be used to provide a constant current or current limiting function. These and other modifications will be readily apparent to those skilled in the art and may freely be chosen to suit the particular application.

The circuit shown in FIG. 9 is provided with power conservation features as follows. Further transistors T68, T74, T78, T85 and T89 are provided to turn off their respective current mirror circuits 346, 356, 360, 362 and 364, when logic signal ON has value '0'. Because transistor T74 is in a ground referenced part of the circuit, signal ON cannot be used to control T74, and signal A at terminal 121 is used. Ground referenced signal A is generated for other purposes by the charge pump circuit of FIG. 8, but is suitable for turning on transistor T74 when the power switch is 'off', thereby disabling the current mirror 356. Transistor T73 is also provided to disconnect the current source RD15 of the differential amplifier 340 from supply terminal 114 when IN='0' (GND). In this way, current consumption in the 'off' state is minimized so as to be only a negligible drain on the vehicle battery.

Figure 10:
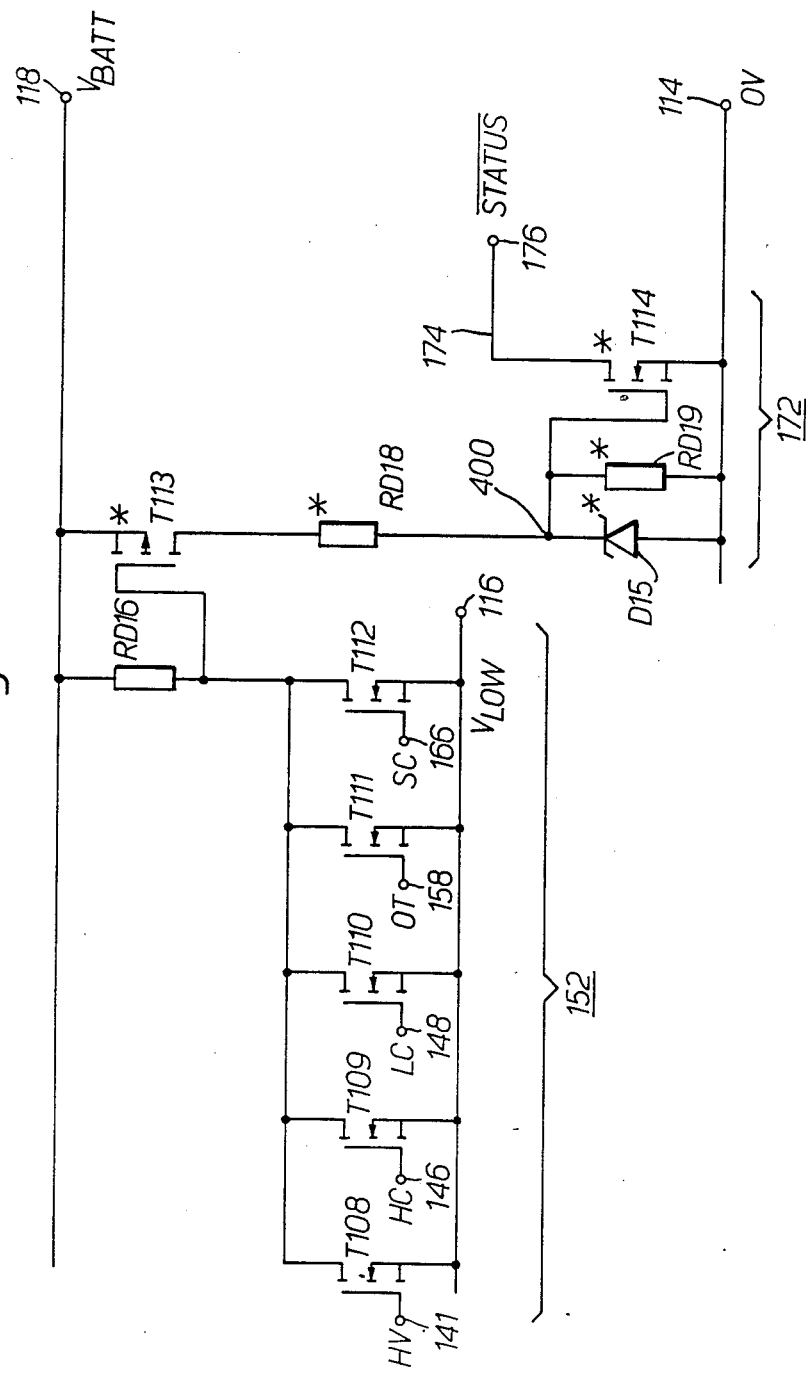
FIG. 10 shows a circuit suitable for use as a short circuit detection circuit in the circuit of FIG. 4.

The circuit shown in FIG. 10 includes the nMOS NOR gate 152 of FIG. 4 which has five inputs comprising the gates of five n-channel transistors T108–T112, which are connected via terminals 141 (HV), 146 (HC), 148 (LC), 158 (OT) and 166 (SC) respectively to other parts of the power switch circuit as shown in FIG. 4. The sources of the transistors T108–T112 are connected to supply terminal 116 ($V_{LOW}$) and the drains of transistors T108–T112 are connected together to form the output 170 of NOR gate 152. The output 170 is connected via a resistance device RD16 to supply terminal 118 ($V_{BATT}$), and also to the gate of a high-voltage p-MOS transistor T113, which gate forms the input to the level shifting circuit 172.

The source of T113 is connected to supply terminal 118 ($V_{BATT}$), while the drain of T113 is connected to one end of a resistance device RD18, the other end of which is connected to a node 400. Another resistance device RD19 is connected between node 400 and supply terminal 114 (GND) to form a potential divider with RD18, and a breakdown diode D15 in parallel with RD19 has its cathode connected to the node 400 and its anode connected to the terminal 114. The node 400 is connected to the gate of a high-voltage n-channel output transistor T114, which has its source connected to terminal 114 (GND) and has its drain which forms output 174 connected to output terminal 176 ($\overline{STATUS}$).

In operation, the input signals HV, HC, LC, OT and SC are NOR'ed to give a resulting signal at 170 which is a '1' if all of the input signals are '0' (i.e. no fault condition detected), and is a '0' if any one or more of those signals is a '1', i.e. at times when there is a high-voltage spike on the supply, too high or too low an output current, too high a temperature at the power MOST or a short-circuited output. If a fault is detected, then T113 is turned on and current flows through the potential divider, turning-on output transistor T114. The diode D15 limits the voltage at the gate of T114 to 12 volts or so, to prevent damage to T114. Thus the open-drain output 174 at terminal 176 is pulled low when a fault condition is detected, and is floating otherwise. A pull-up resistance could be provided between output 174 and terminal 118 ($V_{BATT}$), but this open-drain arrangement will allow the status outputs of more than one intelligent power switch chip to be wire-OR'ed, if desired, to provide a single status indication for all or some part of the electrical system. Also, by using an open-drain arrangement, the output signal $\overline{STATUS}$ is suitable for use by ground-referenced external circuitry, whether that circuitry operates at TTL levels (0–5V) or at the full supply voltage, allowing more flexibility of application. Transistor T114 is preferably a larger-sized device, having a wider channel, so that it has a lower on-resistance and can drive a wider range of circuitry which may be connected to the terminal pin 176.

Figure 11:
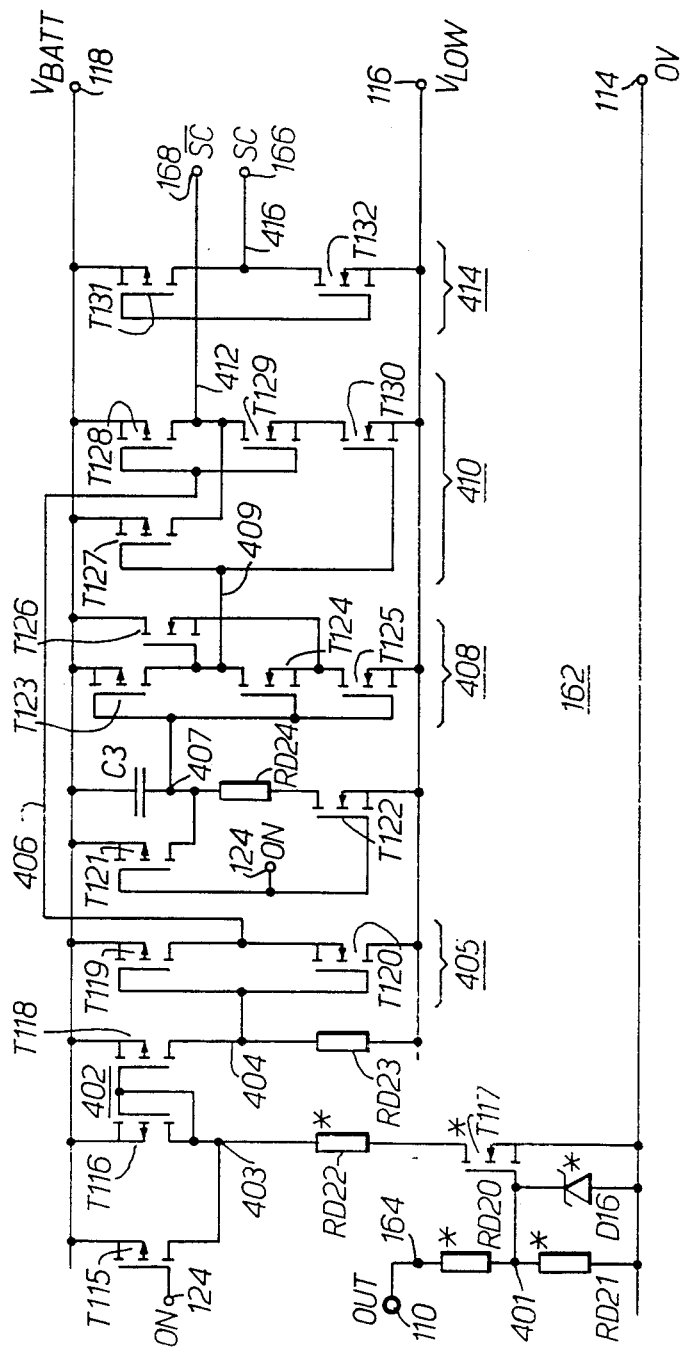
FIG. 11 shows a circuit suitable for use as a logic circuit and level shifter in the circuit of FIG. 4.

FIG. 11 shows the short circuit detection circuit 162 which is connected to supply terminals 114 (GND), 116 ($V_{LOW}$) and 118 ($V_{BATT}$). The circuit 162 has an input 164 connected to the power-switch output terminal 110 (OUT), and complementary outputs 166 (SC) and 168 ($\overline{SC}$). A potential divider comprising two resistance devices RD20 and RD21 is connected between input 164 (OUT) and supply terminal 114 (GND). The output 401 of the divider is connected to the gate of a high-voltage n-channel transistor T117, and to the cathode of a breakdown diode D16, whose anode is connected to terminal 114. The transistor T117 has its source connected to terminal 114 and its drain connected to one end of another resistance device RD22. A current mirror 402 comprises two p-channel transistors T116 and T118, with its input 403, formed by the drain and gate together of input transistor T116, being connected to the other end of resistance device RD22.

A p-channel transistor T115 is connected in parallel with the input transistor T116 of the current mirror, but with the gate of T115 being connected to terminal 124 (ON), shown in FIGS. 4 and 5. The sources of transistors T115, T116 and T118 are all connected to the supply terminal 118 ($V_{BATT}$). The drain of transistor T118 forms the output 404 of the current mirror 402, and is connected via a further resistance device RD23 to the low-voltage supply terminal 116 ($V_{LOW}$). A conventional CMOS inverter 405 comprising two transistors T119 and T120 has its input connected to the output 404 of the current mirror 402.

A p-channel transistor T121 has its source connected to terminal 118 ($V_{BATT}$), its gate connected to terminal 124 (ON), and its drain connected to a node 407. A capacitor C3 is connected between node 407 and the supply ($V_{BATT}$). A further resistance device RD24 has one end connected to the node 407 and another end connected via an n-channel transistor T122 to the supply terminal 116 ($V_{LOW}$). The gate of T122 is connected with that of T121 to the terminal 124 (ON). The node 407 is connected to the input of a conventional CMOS Schmitt trigger circuit 408, which comprises four transistors T123 to T126. The output 409 of the Schmitt trigger 408 is connected to one input of a conventional CMOS 2-input NAND gate 410, which comprises four transistors T127 to T130 and has its other input connected to the output 406 of the inverter 405. The output 412 of the NAND gate 410 is connected to the output 168 ($\overline{SC}$), and also to the input of another CMOS inverter 414, which comprises two transistors T131 and T132 and has its output connected to the output 166 (SC).

In operation, when the desired state for the power switch is 'off', then ON='0' and so transistor T115 is on, and current mirror 402 is held off. The level at the input of the inverter 405 is then held low by RD23, and so the input of NAND gate 410 which is driven by output 406 of the inverter 405 is high ('1'). Still in the 'off' state, ON='0' causes transistor T121 to be turned on and transistor T122 to be turned off, so that node 407 is high (near $V_{BATT}$) and capacitor C3 is discharged. Thus the Schmitt trigger 408, which performs a threshold detection and inversion function, holds its output 409 low, and so the NAND gate 410 has one high and one low input, and generates a '1' at its output 412 accordingly.

Thus, signal $\overline{SC}$ at output 168 is high and because of inverter 414 signal SC at output 166 is low, thereby indicating a no fault condition.

When the desired state changes to 'on', i.e. input signal ON='1', transistor T115 turns off, releasing the input of the current mirror 402. The components RD20, RD21, D16 and T117 and the current mirror 402 can then act as a level shifting circuit similar to that described hereinbefore with reference to FIG. 5. If the output terminal 110 (OUT) rises to near $V_{BATT}$ when signal ON goes high, then the output 404 of the current mirror 402 goes high and the output 406 of the inverter 405 goes low. This applies a zero input to the NAND gate 410, which then holds its output high, irrespective of the level at the output 409 of the Schmitt trigger 408. Thus $\overline{SC}$ remains high and SC remains low, indicating that any load connected between terminal 110 (OUT) and terminal 114 (GND) has been energized, and there is no short-circuit.

If, on the other hand, there is a short circuit between terminals 110 and 114, or if for any other reason the voltage at terminal 110 (OUT) does not rise above a few volts, then T117 and the current mirror 402 will remain off, and the level applied to the input of the NAND gate 410 by inverter 405 will be high. In that case, the output of the NAND circuit determined by the output 409 of the Schmitt trigger 408. When input signal ON goes high, transistor T121 turns off and transistor T122 turns on, so that capacitor C3 begins to charge via resistance device RD24, and the input at 407 to the trigger circuit 408 gradually falls toward $V_{LOW}$. The values of C3 and RD24 are such that there is a delay of a few tens of microseconds before the trigger threshold is reached and the output 409 goes to '1'. Thus the input of the NAND gate 410 does not go high immediately when ON goes high, but does after a time delay. If, after this time, the load has not been energized, then the output 412 of NAND gate 410 goes low, and so output signal SC='0' and signal $\overline{SC}$='1', indicating a short-circuit fault. The time delay is provided so that the power MOST and load are allowed sufficient time to turn fully on before it is checked whether there is a short circuit or not. A delay of 40 or 50 microseconds is long enough for this purpose, while not being so long that the power MOST will be damaged by the high short-circuit output current. If RD24 is constructed using a shorted-gate-source depletion mode transistor, as described hereinbefore then a value of 160 picofarads for capacitor C3 may give a suitable time delay.

Further, it may be desirable that some delayed feedback be provided in the circuit of FIG. 11, so that, in the event of a short circuit, the power switch does not switch off indefinitely but rather periodically tries to turn-on the power output device in case the short-circuit has cleared.

From reading the present disclosure, other modifications and fields of application will be apparent to persons skilled in the art. Such modifications may involve other features which are already known in the design and use of high-voltage and/or high-power semiconductor devices, and of integrated low-power logic and analog circuits, and component parts thereof, which features may be used instead of or in addition to features already described herein. Although claims have been formulated in the application to particular combinations of features, it should be understood that the scope of the disclosure of the present application also includes any novel feature or any novel combination of features disclosed herein either explicitly or implicitly or any generalization of one or more of those features which would be apparent to persons skilled in the art, whether or not it relates to the same invention as presently claimed in any claim and whether or not it mitigates any or all of the same technical problems as does the present invention.

What is claimed is:

1. A power switching circuit suitable for controlling a load in an electrical system having a positive, high-voltage supply terminal and a negative common return terminal, the circuit being connected in operation between the high-voltage supply terminal and one terminal of the load, another terminal of the load being connected to the return terminal, the circuit comprising an electrically conductive semiconductor substrate carrying a high-voltage semiconductor output device in which conduction is predominantly by electrons, the substrate comprising a region of the output device for connection to the high-voltage supply terminal, the substrate also carrying at least one low-voltage semiconductor device forming part of a low-voltage circuit connected in operation to two low-voltage supply terminals, characterized in that the circuit further comprises means for eliminating the need for high-voltage isolation between the low-voltage device and the semiconductor substrate by maintaining each of the two low-voltage supply terminals at no more than a low and substantially constant voltage with respect to the positive high-voltage supply terminal.

2. A circuit as claimed in claim 1, wherein the output device comprises a vertical power semiconductor device.

3. A circuit as claimed in claim 1 or claim 2, wherein the output device is an n-channel DMOS power transistor, the substrate comprising at least part of the drain region of the DMOS transistor.

4. A circuit as claimed in claim 1 or claim 2, wherein the high-voltage semiconductor output device is a n-p-n bipolar power transistor, the substrate comprising at least part of the collector region of the bipolar transistor.

5. A circuit as claimed in claim 1 or claim 2, wherein the low-voltage semiconductor device is a lateral MOS transistor and the low-voltage circuit is a complementary MOS (CMOS) circuit.

6. A circuit as claimed in claim 5, in which the body region of at least one p-channel low-voltage MOS transistor in the low-voltage circuit is continuous with the electrically conductive substrate and is connected to the high voltage supply terminal.

7. A circuit as claimed in claim 1 or claim 2, wherein at least one low-voltage semiconductor device is a bipolar transistor.

8. A circuit as claimed in claim 1 or claim 2, wherein the means for maintaining the low and substantially constant voltages comprises at least one breakdown diode for defining a voltage of the low-voltage supply with respect to the voltage at the high-voltage supply terminal.

9. A circuit as claimed in claim 1 or claim 2, wherein the means for maintaining the low and substantially constant voltages comprises series-connected MOS transistors for defining a voltage of the low-voltage supply with respect to the voltage at the high-voltage supply terminal.

10. A circuit as claimed in claim 1 or claim 2, wherein the means for maintaining the low and substantially constant voltages is integrated monolithically with the high- and low-voltage semiconductor devices.

11. A circuit as claimed in claim 1 or claim 2, in which one of the low-voltage supply terminals is connected directly to the relatively positive high-voltage supply terminal.

12. A circuit as claimed in claim 1 or claim 2, comprising a level-shifting circuit for interfacing between high-voltage referenced low-voltage circuitry and another part of the circuit.

* * * * *